(12) United States Patent
Yoshikawa

(10) Patent No.: US 7,772,677 B2
(45) Date of Patent: Aug. 10, 2010

(54) SEMICONDUCTOR DEVICE AND METHOD OF FORMING THE SAME HAVING A JUNCTION TERMINATION STRUCTURE WITH A BEVELED SIDEWALL

(75) Inventor: Koh Yoshikawa, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 106 days.

(21) Appl. No.: 11/670,419

(22) Filed: Feb. 2, 2007

(65) Prior Publication Data

US 2007/0176244 A1  Aug. 2, 2007

(30) Foreign Application Priority Data

Feb. 2, 2006  (JP) ............... 2006-026190

(51) Int. Cl.
*H01L 29/78* (2006.01)
*H01L 21/336* (2006.01)
(52) U.S. Cl. .............. 257/623; 257/133; 257/171; 257/605; 257/618; 257/E29.006; 257/E29.007
(58) Field of Classification Search .......... 257/623, 257/606, 605, 133, 171, 618, E29.006, E29.007
See application file for complete search history.

(56) References Cited

U.S. PATENT DOCUMENTS

| | | |
|---|---|---|
| 4,904,609 A | 2/1990 | Temple |
| 6,639,301 B2 * | 10/2003 | Andoh ............... 257/606 |
| 6,677,626 B1 * | 1/2004 | Shindou et al. ........... 257/266 |

(Continued)

FOREIGN PATENT DOCUMENTS

JP  S47-24984 A  10/1972

(Continued)

OTHER PUBLICATIONS

Title: Improving reliability of beveled power semiconductor devices passivated by SIPOS. Authors: Ying Wang, Cangchun Zhu, Chunyu Wu, Junhua Liu. Journal: Mircoelectronics Reliability 45 (2005). Avaliable online Nov. 2004. pp. 535-539.*

(Continued)

*Primary Examiner*—Fernando L Toledo
*Assistant Examiner*—John P Dulka
(74) *Attorney, Agent, or Firm*—Rossi, Kimms & McDowell LLP

(57) ABSTRACT

A semiconductor device has a semiconductor substrate including an n-type high impurity concentration layer inhibiting a depletion layer from spreading, an n-type low impurity concentration drift layer, and a p-type high impurity concentration layer forming a p-n main junction between the drift layer. In the active region, an effective current flows in the direction of the thickness of the substrate. The device has an inclined trench that cuts the p-n main junction at a positive bevel angle from the semiconductor substrate surface on the side of the n-type high impurity concentration layer to penetrate through the substrate for separating it into chips. In the device, along the sidewall of the inclined trench in the n-type drift layer, an n-type surface region is formed with an impurity concentration lower than that in the n-type drift layer.

15 Claims, 21 Drawing Sheets

U.S. PATENT DOCUMENTS

2004/0075160 A1* 4/2004 Eng et al. .................. 257/623
2004/0079987 A1* 4/2004 Shimizu .................... 257/315

FOREIGN PATENT DOCUMENTS

| JP | S48-43868 A | 6/1973 |
|---|---|---|
| JP | S48-55676 A | 8/1973 |
| JP | S48-95776 A | 12/1973 |
| JP | S48-96080 A | 12/1973 |
| JP | S50-134376 A | 10/1975 |
| JP | S50-135988 A | 10/1975 |
| JP | 2-22869 A | 1/1990 |
| JP | 06-334188 A | 12/1994 |
| JP | 2001-185727 A | 7/2001 |
| JP | 2005-136064 A | 5/2005 |
| JP | 2005136064 A * | 5/2005 |

OTHER PUBLICATIONS

Title: Application of ultra-high energy boron implantation for superjunction power (CoolMos -trademark) devices. Authors: J. von Borany, M. Friedrich, M. Rub, G. Deboy, J, Butschke, F. Letzkus. Journal: Nuclear Instruments and Methods in Physics Research B 237 (2005). pp. 62-67.*

Title: The influence of surface charge and bevel angle on the blocking behavior of a high-voltage p+-n-n+ device. Authors: K.-P. Brieger, Willi Gerlach, and Joachim Pelka. Journal: IEEE Transactions on electron devices, vol. Ed-31, No. 6, Jun. 1984. pp. 733-738.*

Title: Junction termination extensions (JTE), A new technique for increasing avalanche breakdown voltage and controlling. surface electric fields in p-n junctions. Author: Victor A.K. Temple. Journal: Electron Devices Meeting, 1977 International. vol. 23 (1977). pp. 423-426.*

* cited by examiner

TYPE-A: THE CASE WITH n-TYPE SURFACE REGION

TYPE-B: THE CASE WITHOUT n-TYPE SURFACE REGION

SEMICONDUCTOR DEVICE AND METHOD OF FORMING THE SAME HAVING A JUNCTION TERMINATION STRUCTURE WITH A BEVELED SIDEWALL

BACKGROUND

In a semiconductor device such as a diode, a BJT, a superjunction MOSFET, or an IGBT in which a number of semiconductor devices are formed in a semiconductor wafer, a planar type junction termination structure is mainly used as a breakdown voltage blocking structure of the device. In the planar type junction termination structure, the termination of a p-n junction is made to intersect the principal surface of a semiconductor wafer and the surface of the intersection is coated with a passivation film such as an insulator film for protection.

A planar type breakdown voltage blocking structure is normally arranged around the outer periphery of an active region positioned at the central section of a semiconductor device. The breakdown voltage blocking structure has a junction termination structure including a curved p-n junction face linking to the outer periphery of a planar p-n junction face corresponding to an active region. In the planar type breakdown voltage blocking structure having the curved p-n junction face, a reverse voltage applied to a p-n main junction is liable to form a section with high electric field strength due to an electric field concentration appearing at a region beneath the curved junction face in comparison with a region beneath the planar junction face in the active region. This, when no measure is taken, causes the electric field strength at the region beneath the curved junction face to reach the critical electric field strength of breakdown determined by the kind of a semiconductor crystal by an applied voltage lower than the design breakdown voltage at the planar junction. Thus, the device has a low breakdown voltage.

As measures against this, an electric field concentration at a region beneath a curved junction face has been previously reduced to enhance the breakdown voltage of a device by providing the following breakdown voltage blocking structures. The breakdown voltage blocking structures are those such as a breakdown voltage blocking structure 121 including a floating guard ring structure 131 and a field plate structure 132 as shown in FIG. 21, which illustrates a cross-sectional view of a planar type junction termination structure around the outermost periphery of a planar type semiconductor substrate of a semiconductor device, and a RESURF structure (not illustrate) that will be described later (see JP-A-6334188), or some combination of them. In general, the surface of the breakdown voltage blocking structure 121 of the planar type semiconductor substrate is often formed flush with the surface of an active region 110 around the outer periphery of the active region 110. Furthermore, the necessary width for the breakdown voltage blocking structure on the surface of the semiconductor substrate increases with an increase in the breakdown voltage. Therefore, particularly in a high breakdown voltage semiconductor substrate (chip), the area ratio of the breakdown voltage blocking structure to the entire area of the chip becomes relatively larger as the area of the chip becomes smaller, which makes the chip disadvantageous at to electrical characteristics and cost.

FIG. 22 is a cross-sectional view showing a breakdown voltage blocking structure (junction termination structure) around the outermost periphery of a related trench type semiconductor device. The semiconductor device has a semiconductor wafer 150 in which a p-n main junction 117 is formed by providing a p$^-$ epitaxial layer 112 on an n$^{++}$ semiconductor substrate 111. In the semiconductor wafer 150, an inclined trench 115 is formed from the principal surface of the semiconductor wafer 150 with a depth deeper than the position of the main p-n junction 117 by a trench forming technology with dry or wet etching. On the inner surface of the inclined trench 115, a trench inner surface layer 114 of an n$^+$-type is formed. The trench inner surface layer 114 is formed in contact with the p$^-$ drift layer 112 (the p$^-$ epitaxial layer 112) with one surface with an impurity dose ten times or more the dose for the p$^-$ drift layer 112. As a result, the trench inner surface layer 114 is to connect the n$^{++}$ semiconductor substrate 111 and an n$^+$-layer 113, formed on the respective principal surfaces of the p$^-$ drift layer 112, with the same conductivity type. A reverse bias voltage applied to the main p-n junction 117 makes an end of a depletion layer formed on the side of the p$^-$ drift layer 112 extend to the top principal surface of the p$^-$ drift layer 112. The top principal surface of the p$^-$ drift layer 112 is protected by a protection film (not shown) such as an oxide film, by which a breakdown voltage is to be held. For obtaining a high breakdown voltage also in such a breakdown voltage blocking structure, a width (distance) 116 on the top surface must be increased. The increased width 116 reduces an effective active region area by the amount of increase. This, as described before, is more disadvantageous for a smaller area chip in current capacity and as well as in cost.

Such a planar type breakdown voltage blocking structure has been already well known, where a trench is applied to extension of an end of a depletion layer from a drift layer to the top principal surface of a substrate, for instance in JP-A-2-22869, which corresponds to U.S. Pat. No. 4,904,609. Descriptions of similar structures are found in other patent documents, including for example FIG. 15(c) and FIG. 24 of JP-A-2001-185727. None of the described structures, however, provides improvements relating to the area ratio of the surface of a breakdown voltage blocking structure to the entire area of a chip.

Referring FIG. 23, which illustrates a reprint of the breakdown voltage blocking structure around the outermost periphery of the trench type semiconductor device (a diode) described in JP-A-2005-136064, a related technology of improving the area ratio is presented. The device is a non-planar type semiconductor device provided with a junction termination on the inner surface of a trench 605, which device is a kind of a mesa semiconductor transistor. The junction termination is inclined at an angle in the negative bevel direction to a p-n main junction 600 between a P$^+$ anode region 604 and an N$^-$ drift layer 601. In the device, when a reverse bias voltage (with a cathode electrode 609 made positive and an anode electrode 608 made negative) is applied to the p-n main junction 600, the end of a depletion layer spreads only to the trench 605 without extending to the principal surface of a semiconductor wafer. This way, a kind of a RESURF structure is formed in which a P$^-$ surface region 606 extends from the P$^+$ anode region 604 along the inner surface of the trench 605. By the thus formed RESURF structure, extension of the depletion layer in the P$^-$ surface region 606 is controlled to reduce the electric field concentration in the inner surface of the trench 605 for inhibiting reduction in the breakdown voltage, as well as improving the area ratio of the breakdown voltage blocking structure to the entire chip area.

However, when the breakdown voltage blocking structure shown in FIG. 23 is applied to a device having a drift layer with a relatively high resistivity such as a superjunction MOSFET, an IGBT, or a diode (in particular a superjunction structure close to a charge balanced state with the average impurity concentration close to an intrinsic one), electric field strength tends to be high at the interface between the N$^-$ drift layer 601 and an N$^{++}$-layer 602. As a result, the semiconductor device described in JP-A-2005-136064 (FIG. 23) sometimes causes breakdown at a low applied voltage, so that it is hard to ensure a sufficiently high breakdown voltage.

This will be explained in the following. FIG. 24 is a diagram showing electric field strength distributions along line B-B' of FIG. 23 when a reverse bias voltage is applied to the device shown in FIG. 23. In the diagram, a distance from the principal surface of the device is taken on the horizontal axis and an electric field strength is taken on the vertical axis. Moreover, the notation "n$^{++}$" in the diagram represents the N$^{++}$-layer 602 in FIG. 23 and the notation "n$^-$" in the diagram represents the N$^-$ drift layer 601. The notation "SJ" represents the superjunction structure. The dotted line with the indication "TYPE-1" represents the electric field strength distribution from the N$^-$ drift layer 601 or the superjunction structure (hereinafter also referred to as the "SJ") to the N$^{++}$-layer 602 when the N$^-$ drift layer 601 has a low resistivity. The solid line with the indication "TYPE-2" represents the electric field strength distribution when the N$^-$ drift layer 601 has a high resistivity. In the diagram, it is known that, in the N$^-$ drift layer 601 with any resistivity, at an interface shown with an arrow, i.e., at a surface of the interface between the N$^-$ drift layer 601 and the N$^{++}$-layer 602 (on the surface in the trench 605), the electric field strength becomes so high as to reach a value approximately equal to that of the critical electric field strength of the semiconductor crystal (shown by "E(CRIT.) on the vertical axis). In this way, with the structure shown in FIG. 23, a sufficient design breakdown voltage sometimes could not be ensured.

There still remains a need for providing a semiconductor device that prevents the electric field strength from reaching the critical electric field strength, which can break down the breakdown blocking structure (hereinafter referred to as a "junction termination structure"), prior to in an active region, as well as improving the area ratio of the junction termination structure to the entire chip area. The present invention addresses this need.

SUMMARY OF THE INVENTION

The present invention relates to a semiconductor device, in particular, a power semiconductor device mainly used for an electric power conversion system or the like, and more in particular, to a junction termination structure of a semiconductor device such as a diode, a BJT, a superjunction MOSFET or an IGBT, and a method of manufacturing the same.

One aspect of the present invention is a semiconductor device that has a semiconductor substrate, an active region in the substrate where current flows in the direction of the thickness of the semiconductor substrate, and a junction termination structure surrounding an outer periphery of the active region.

The substrate includes a first high impurity concentration layer of a first conductivity type, a low impurity concentration drift layer of the first conductivity type, and a second high impurity concentration layer of a second conductivity type. The second high impurity concentration layer and the drift layer form a p-n main junction therebetween. The drift layer is formed between the first high impurity concentration layer and the second high impurity concentration layer.

The junction termination structure includes a sidewall extending between the first high impurity concentration layer and the second high impurity concentration layer. The sidewall forms a positive bevel angle with respect to a principal surface of the first high impurity concentration layer. The junction termination structure further includes a surface region of the first conductivity type extending along the sidewall and extending between the first high impurity concentration layer and the second high impurity concentration layer. The surface region has an impurity concentration lower than an impurity concentration of the first high impurity concentration layer and an impurity concentration of the second high impurity concentration layer, but higher than an impurity concentration of the drift layer.

The first high impurity concentration layer and the sidewall form an acute angle between 30° and 85°. The dose in the ion implantation with impurity ions is within a range from $5.0 \times 10^{11}$ cm$^{-2}$ to $1.6 \times 10^{12}$ cm$^{-2}$. When the angle is approximately 54°, the dose for the impurity in the surface region is within a range between $6.2 \times 10^{11}$ cm$^{-2}$ and $1.4 \times 10^{12}$ cm$^{-2}$. When the angle is approximately 85°, the dose for the impurity in the surface region is $5.0 \times 10^{12}$ cm$^{-2}$ or less. When the angle is approximately 30°, the dose for the impurity in the surface region is within a range between $5.0 \times 10^{11}$ cm$^{-2}$ and $1.6 \times 10^{12}$ cm$^{-2}$.

The junction termination structure can further include a passivation film formed on the sidewall. The passivation film can be an insulator film including a silicon oxide film, such as formed by applying.

The semiconductor device can be a MOSFET, a diode, or an IGBT. The drift layer can have a superjunction structure including pin stripe regions of the first conductivity type and pin stripe isolating regions of the second conductivity type perpendicular to the principal surface of the first high impurity concentration layer and arranged alternately, adjacently, and parallel with each other.

Another aspect of the present invention is forming the above-described semiconductor device by forming the semiconductor device, the active region, and the junction termination structure. The surface region can be formed by ion implantation with impurity ions. The ion implantation with impurity ions can be carried out perpendicularly to the principal surface of the first high impurity concentration layer. The passivation film can be formed by application.

DETAILED DESCRIPTION

Figure 1:
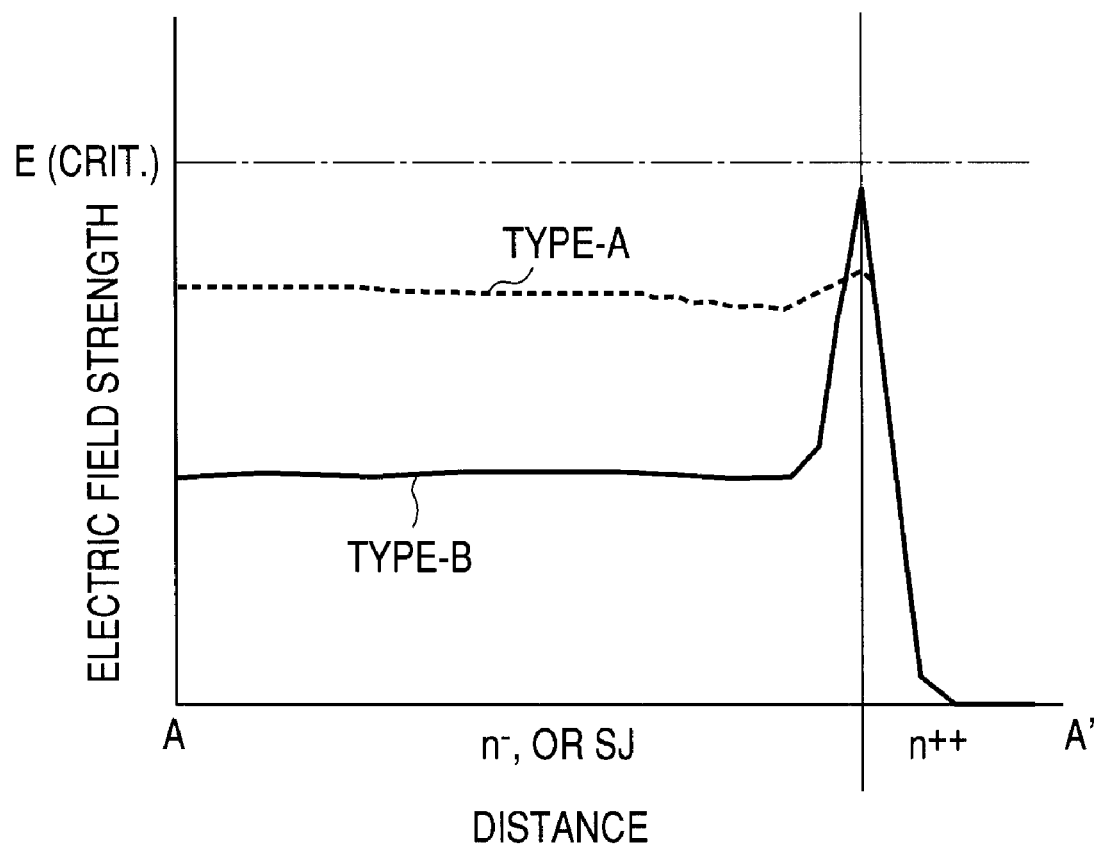
FIG. 1 is a diagram showing electric field strength distributions in a junction termination structure of each of a superjunction MOSFET according to Example 1 and diodes according Examples 2 and 3 according to the present invention.

Examples according to the invention will be explained in detail referring to the drawings. The present invention is not to be limited only to the examples provided herein. In the specification and the attached drawings, a leading character "n" or "p" attached to the name of a layer or a region means that majority carriers in the layer or the region are electrons or holes, respectively. Moreover, a sign "+" attached to the leading character "n" or "p" means that the layer or the region has a comparatively high impurity concentration, and a sign "−" attached to the leading character "n" or "p" means that the layer or the region has a comparatively low impurity concentration. Furthermore, a sign "++" means that the layer or the region has a further higher impurity concentration. The n-type and p-type structure can be exchangeably used.

In Example 1, a superjunction MOSFET with a breakdown voltage of 600 V is picked up and explanations thereon including the manufacturing method thereof will be made with an emphasis on the junction termination structure. For methods of forming other layer structures, well-known methods can be employed, so that explanations thereof will be given with contents thereof simplified.

FIG. 1 is a diagram showing electric field strength distributions in a junction termination structure of each of the superjunction MOSFET according to Example 1 and the diodes according to Examples 2 and 3. FIG. 2A to FIG. 4B are cross-sectional views showing the manufacturing process steps of the superjunction MOSFET according to Example 1 about a section around the principal part of the junction termination structure thereof. FIGS. 5A and 5B are a cross-sectional view showing the junction termination structure according to Example 1 and a cross-sectional view showing equipotential lines in the junction termination structure, respectively.

Figure 2A:
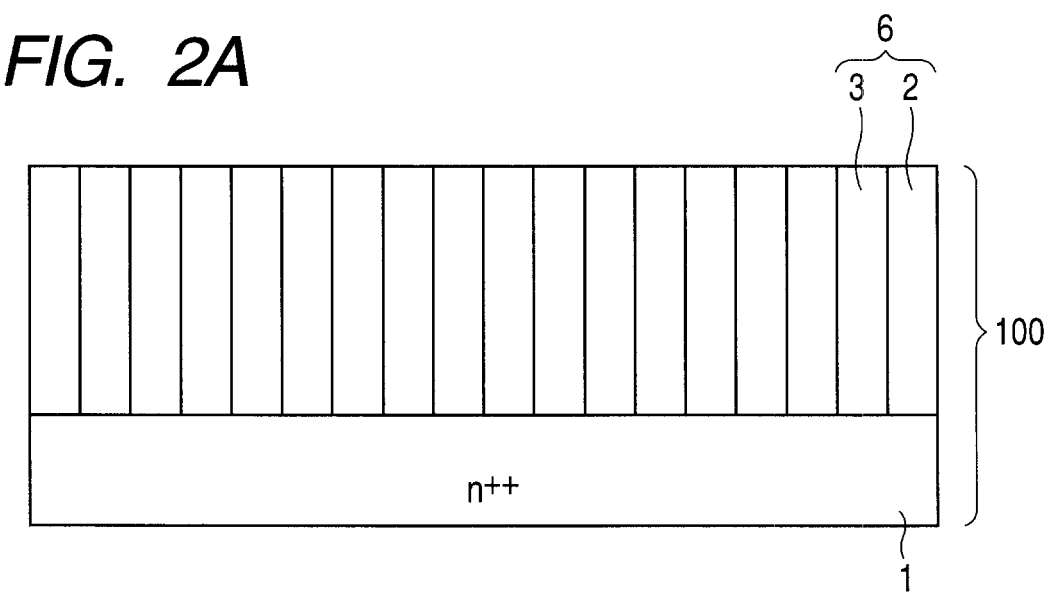
FIG. 2A is a cross-sectional view showing the manufacturing process step of the superjunction MOSFET according to Example 1 of a section around the principal part of the junction termination structure thereof in which step a superjunction substrate having a superjunction structure on an n$^{++}$-type Si semiconductor substrate is formed.

First, an $n^{++}$-type Si semiconductor substrate 1 having a sufficiently high impurity concentration, i.e., having sufficiently low resistance, is prepared. As shown in FIG. 2A, on the substrate 1, a superjunction structure 6 is formed with a thickness of 50 μm (a thickness in the direction perpendicular to the principal surface of the substrate 1) by an epitaxial silicon layer forming technology, a trench forming technology, and a technology of filling the trench with epitaxial silicon. The superjunction structure 6 has pin stripe p-type isolating regions 2 and pin stripe n-type regions 3 that extend in the direction perpendicular to the principal surface of the substrate 1 and are arranged alternately, adjacently, and parallel with each other at a 5 μm pitch. At this time, the impurity concentration of the pin stripe n-type region 3 is preferably prepared so as to be equal to or a little higher than the impurity concentration of the pin stripe p-type isolating region 2. Such a Si substrate with the superjunction structure 6, including the pin stripe p-type isolating regions 2 and the pin stripe n-type regions 3 being perpendicular to the principal surface of the substrate 1 and parallel with each other, mounted on the principal surface of the substrate 1 is taken as a superjunction substrate 100.

Figure 2B:
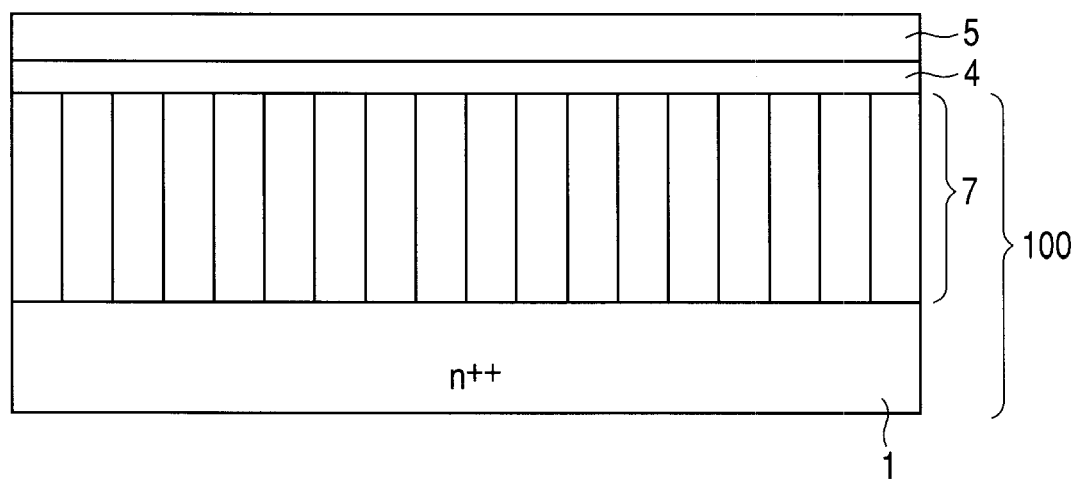
FIG. 2B is a cross-sectional view showing the manufacturing process step next to the step shown in FIG. 2A in which a p$^+$-type well layer and a thermal oxide film are formed on the superjunction structure side of the superjunction substrate.

As shown in FIG. 2B, ion implantation with boron ions is selectively carried out into the principal surface on the superjunction structure 6 side of the superjunction substrate 100. The implanted boron ions are then subjected to driving diffusion at 1150° C., by which a $p^+$-type well layer 4 is formed with a thickness of 3 μm. The superjunction structure other than the $p^+$-type well layer 4 becomes a drift layer 7. Since the driving diffusion of the boron ions for forming the $p^+$-type well layer 4 is carried out in an oxidizing atmosphere, a thermal oxide film 5 with a thickness of 1.6 μm is formed on the surface of the $p^+$-type well layer 4 simultaneously with the driving diffusion. Furthermore, on the principal surface on the superjunction structure side of the superjunction substrate 100, unillustrated constituents such as a gate electrode, an insulator film, a source electrode, and a passivation film are formed according to a well-known method of forming a MOSFET.

Figure 3A:
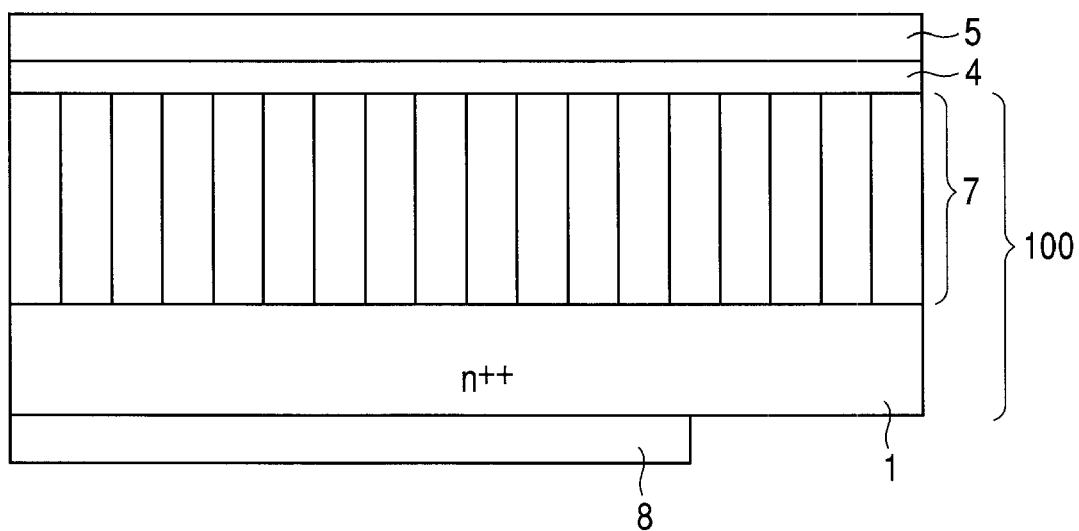
FIG. 3A is a cross-sectional view showing the manufacturing process step next to the step shown in FIG. 2B in which an etching mask is formed on the n$^{++}$-type Si semiconductor substrate side of superjunction substrate.

Thereafter, the superjunction substrate 100 is polished from the bottom surface side thereof (the $n^{++}$-type Si semiconductor substrate 1 side) to a specified thickness (100 μm for a breakdown voltage of 600 V). Then, as shown in FIG. 3A, an etching mask 8 of a film such as an oxide film or a silicon nitride film is formed for forming an inclined trench penetrating through the superjunction substrate 100 from the principal surface on the superjunction structure side to the bottom surface side. The etching mask 8 is formed on the principal surface on the $n^{++}$-type Si semiconductor substrate 1 side with the pattern thereof made to correspond to the pattern of a MOS gate structure on the principal surface on the superjunction structure side by using a double sided mask aligner.

Figure 3B:
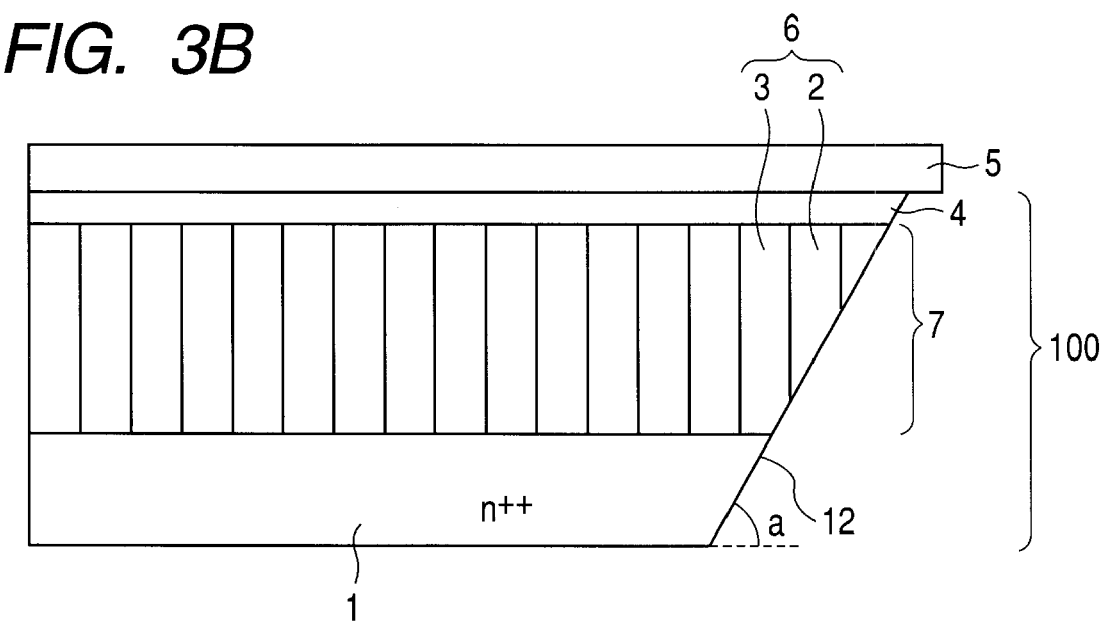
FIG. 3B is a cross-sectional view showing the manufacturing process step next to the step shown in FIG. 3A in which an inclined trench is formed.

Thereafter, as shown in FIG. 3B, etching is carried out from the $n^{++}$-type Si semiconductor substrate 1 side by employing well known technologies such as a Si etching technology and a trench forming technology, by which an inclined trench 12 is formed. The inclined trench 12 is formed into such a v shape or a trapezoidal shape as to surround the outer periphery of the active region of the semiconductor device with a taper angle (inclination angle) "a".

Figure 23:
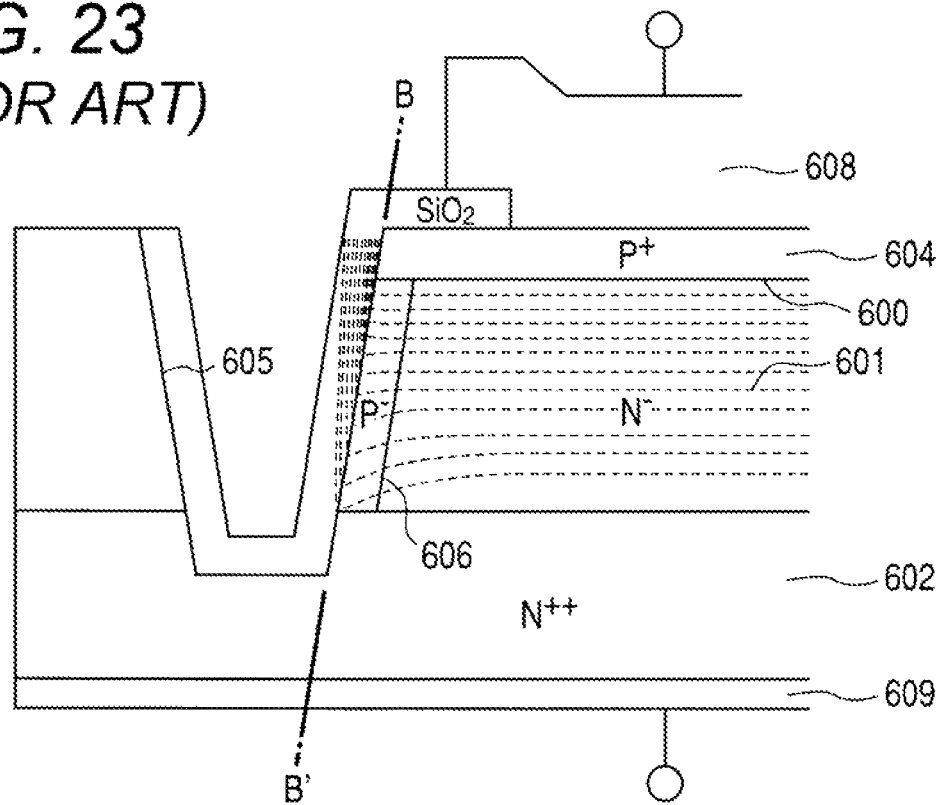
FIG. 23 is a cross-sectional view showing a breakdown voltage blocking structure around the outermost periphery of another related trench type semiconductor device.
Figure 24:
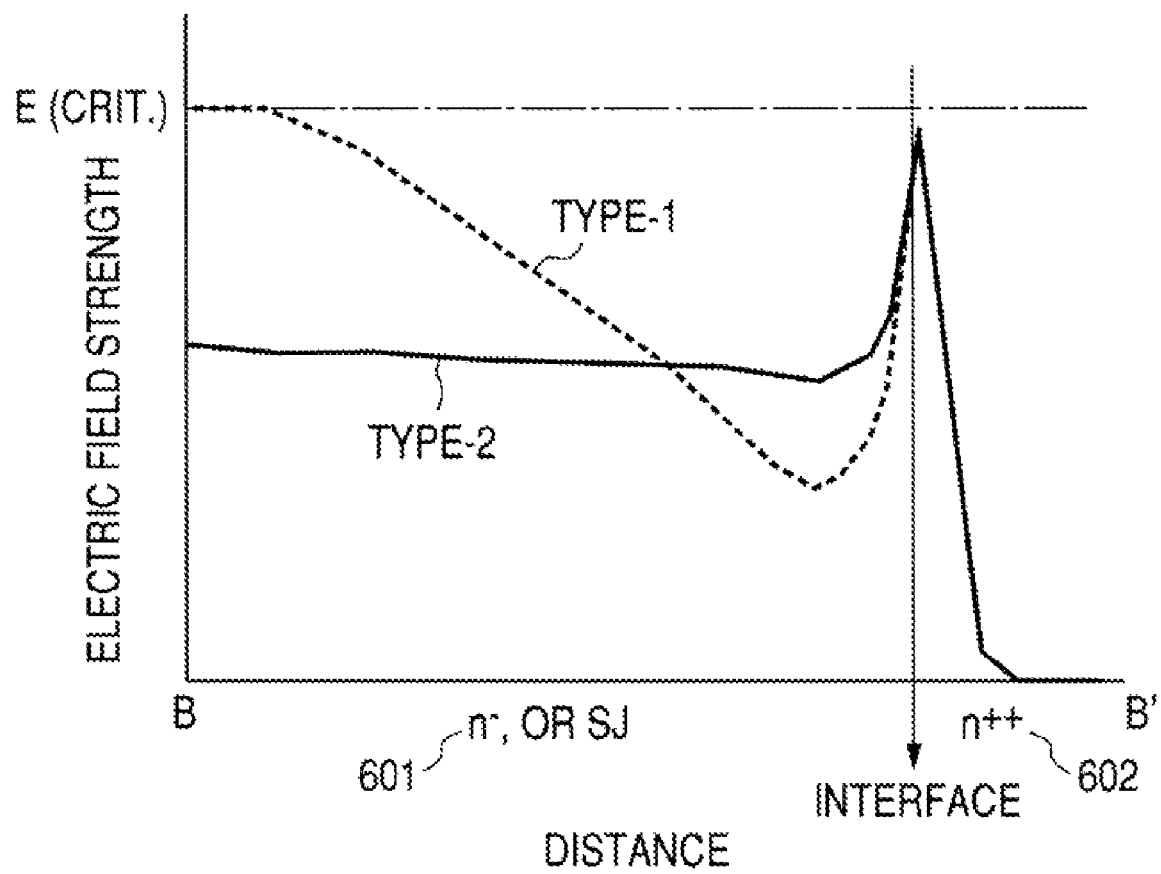
FIG. 24 is a diagram showing electric field strength distributions along line B-B' of FIG. 23 when a reverse bias voltage is applied to the related trench type semiconductor device shown in FIG. 23.

The taper angle "a" is an angle formed by the principal surface of the $n^{++}$-type Si semiconductor substrate 1 and the inclined trench 12. In the invention, the taper angle "a" is preferably provided so that the trench 12 with the taper angle is formed to have a shape with which the width of the bottom on the superjunction structure 6 side is narrower than the opening width at the side of the $n^{++}$-type Si semiconductor substrate 1. In other words, the area of the principal surface of the $n^{++}$-type high impurity concentration layer becomes smaller than the area of the principal surface of the $p^+$-type well layer 4. The taper angle "a" is an acute angle, taking a value larger than 0° but smaller than 90°. The taper angle "a" in Example 1 is 54°. Such an acute taper angle "a" is referred to as a positive bevel angle to the p-n main junction between the $p^+$-type well layer 4 and the drift layer 7 or to the $n^{++}$-type Si semiconductor substrate 1. The inclined trench 12 is provided as being a lattice-like trench when the entire wafer is viewed from the bottom surface side (the $n^{++}$-type Si semiconductor substrate 1 side) of the superjunction substrate 100. A region surrounded by the lattice-like trench becomes a chip of the semiconductor device. Incidentally, the inclined trench 605 of the semiconductor device according to JP-A-2005-136064 shown in present FIG. 23 forms a negative bevel angle to the p-n main junction 600.

Figure 4A:
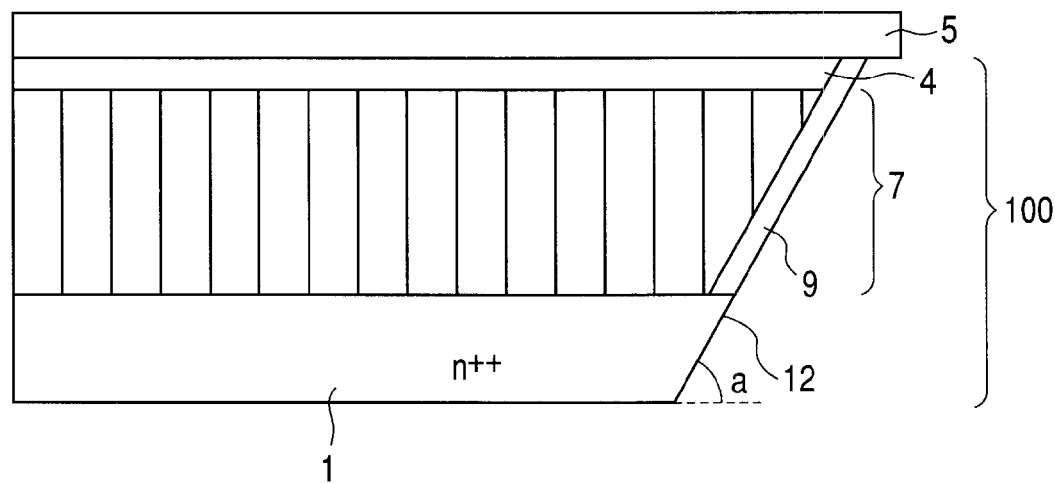
FIG. 4A is a cross-sectional view showing the manufacturing process step next to the step shown in FIG. 3B in which an n-type surface region is formed on the sidewall of the inclined trench.
Figure 5A:
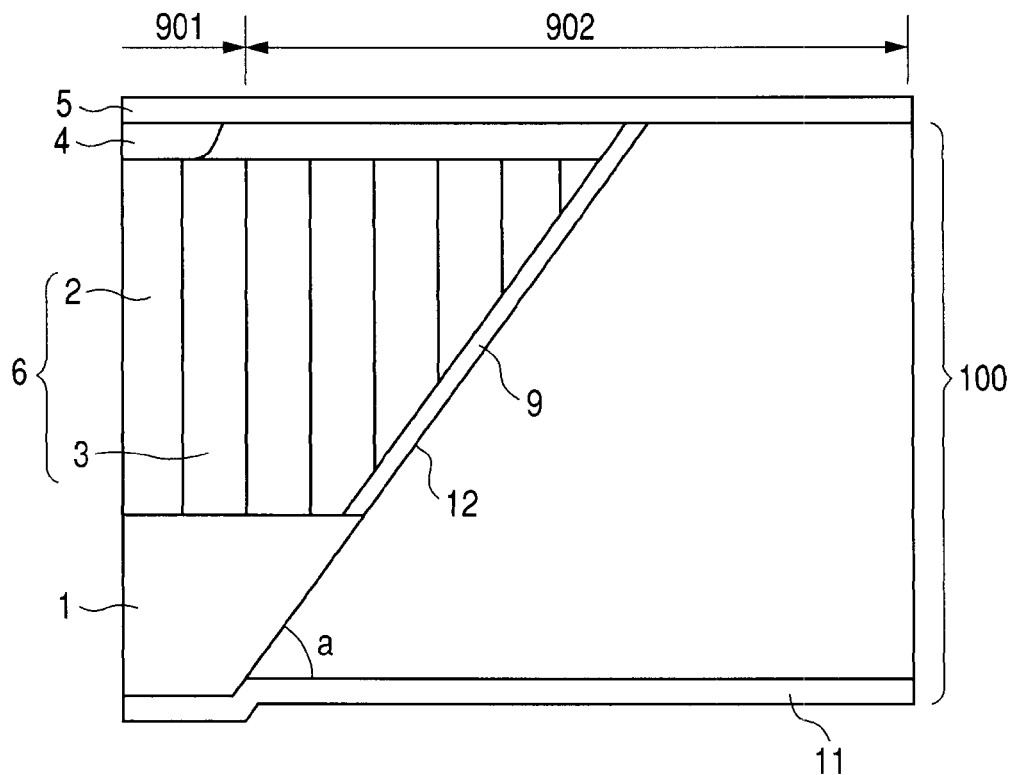
FIG. 5A is a cross-sectional view showing the principal part of the junction termination structure of the superjunction MOSFET according to Example 1.
Figure 5B:
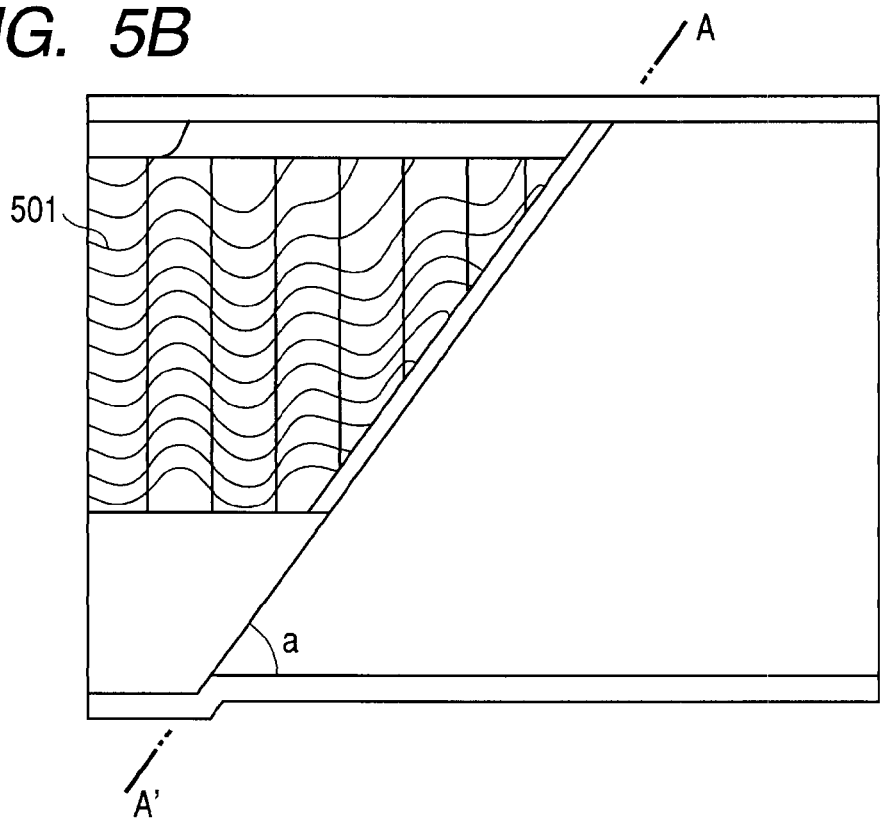
FIG. 5B is a cross-sectional view showing equipotential lines in the junction termination structure shown in FIG. 5A when a reverse bias voltage is applied to the superjunction MOSFET.

Next, as shown in FIG. 4A, an n-type surface region 9 is formed along the surface of the drift layer 7 exposed on the side wall of the inclined trench 12. The n-type surface region extends to, i.e., connects, the $p^+$-type well layer 4 and the substrate 1. For forming the n-type surface region 9, n-type dopant ions such as phosphorus ions are first introduced into the sidewall of the inclined trench 12 by ion implantation carried out in the direction perpendicular to the principal surface of the $n^{++}$-type Si semiconductor substrate 1. Furthermore, the introduced dopant ions are activated by annealing. The annealing is carried out by using an electric furnace at a temperature equal to or less than 500° C. or by laser annealing so as not to thermally damage an unillustrated MOSFET structure formed on the principal surface on the side opposite to the $n^{++}$-type Si semiconductor substrate 1. Moreover, with a material for application such as SOG (Spin-On-Glass), an oxide film 10 is formed on the entire bottom surface of the superjunction substrate 100. By polishing the surface, on which the oxide film 10 is formed, with a polishing method such as CMP (Chemical Mechanical Polishing), the principal surface on the side of the $n^{++}$-type Si semiconductor substrate 1 is exposed with the inclined trench 12 filled with the oxide film 10. Thereafter, as shown in FIG. 4A, a metal film for a drain electrode 11 is formed by sputtering or evaporation to bring the superjunction MOSFET to completion.

In the superjunction MOSFET, with an impurity concentration in each of the pin stripe p-type isolating region 2 and the pin stripe n-type region 3 in the drift layer 7 being approximately $4.5 \times 10^{15}$ cm$^{-3}$, a depletion layer in an active region reaches the $n^{++}$-type Si semiconductor substrate 1 with a voltage lower than the maximum applied voltage (hereinafter referred to as the "breakdown voltage") of the semiconductor device. When the drift layer is provided with the super junction structure, the averaged value of respective concentrations of impurities included in the pin stripe n-type regions and the pin stripe p-type isolating regions can be considered as the impurity concentration of the drift layer.

FIGS. 5A and 5B are a cross-sectional view showing the principal part of the junction termination structure of the superjunction MOSFET according to Example 1 and a cross-sectional view showing equipotential lines 501 in the junction termination structure when a reverse bias voltage is applied to the MOSFET. On the sidewall surface of the inclined trench 12 having a specified taper angle, equipotential surfaces become perpendicular to the sidewall, so that the depletion layer reaches the $n^{++}$-type Si semiconductor substrate 1 with a voltage further lower than the voltage in the active region.

Figure 4B:
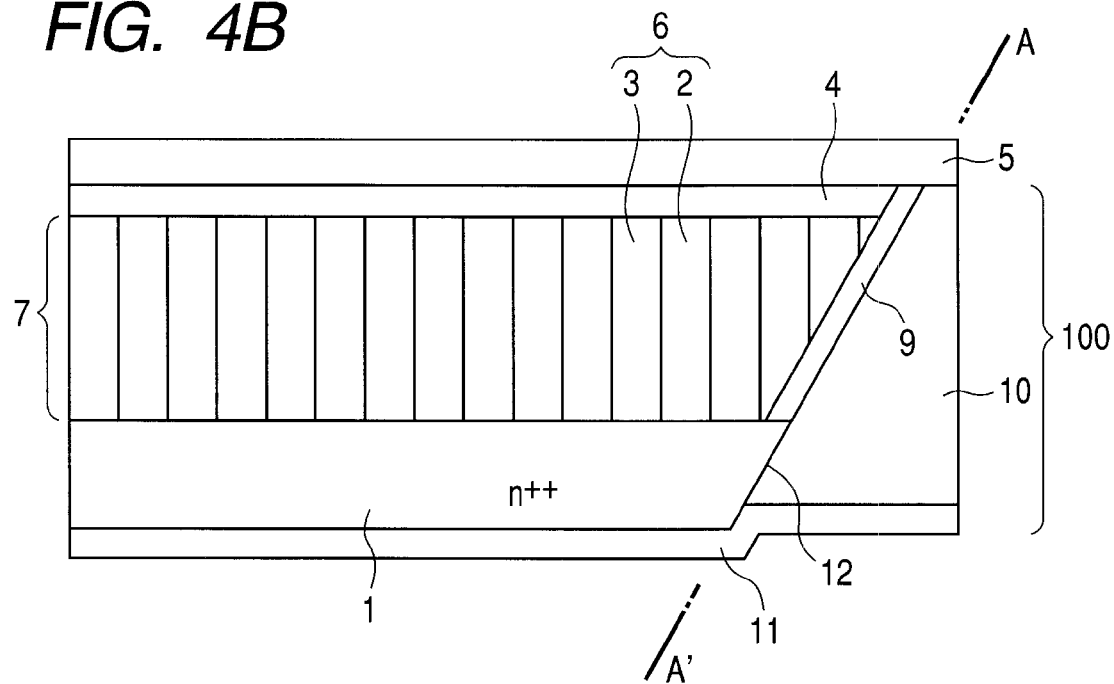
FIG. 4B is a cross-sectional view showing the manufacturing process step next to the step shown in FIG. 4A in which an inclined trench is filled with an oxide film and a drain electrode is formed on the n$^{++}$-type Si semiconductor substrate side of superjunction substrate.

FIG. 1 is a diagram schematically showing electric field strength distributions along line A-A' of FIG. 4B or FIG. 5B when a reverse bias voltage is applied to the MOSFET according to Example 1. In the diagram, the horizontal axis represents a distance from the surface of the drift layer 7 or the superjunction structure 6 and the vertical axis represents electric field strength. The regions with the notations "$n^{++}$" and "SJ" on the horizontal axis correspond to the $n^{++}$-type Si semiconductor substrate 1 and the super junction structure 6, respectively, in FIG. 4B. Moreover, the notation "$n^-$" indicates that the drift layer 7 is an $n^-$-type Si layer. In the diagram, the dotted line with the indication "TYPE-A" represents the electric field strength distribution when the n-type surface region 9 is provided, i.e., Example 1. The solid line with the indication "TYPE-B" represents the electric field strength distribution when no n-type surface region 9 is provided.

Under a reverse bias, a depletion layer in general spreads fully in the drift layer 7 at a specified applied voltage to reach the $n^{++}$-type Si semiconductor substrate 1 and cannot easily spread further. Thus, when the applied voltage is further increased, the electric field strength increases at the interface between the surface of the drift layer 7 and the surface of the $n^{++}$-type Si semiconductor substrate 1. In particular, on the sidewall of the inclined trench 12 with the above-described positive (acute) bevel angle, when no n-type surface region 9 is provided, the electric field strength abruptly increases at the interface between the surface of the drift layer 7 and the surface of the $n^{++}$-type Si semiconductor substrate 1 as is shown with the indication "TYPE-B" in FIG. 1. This is considered to be the result of the following. The taper angle "a" provided as a positive bevel angle allows the depletion layer to extend more easily on the surface of the inclined trench 12 than inside of the semiconductor device. Furthermore, the thickness of the drift layer is smaller than the distance estimated from a design breakdown voltage over which distance the depletion layer extends. Therefore, on the sidewall of the inclined trench around the interface between the $n^{++}$-type Si semiconductor substrate 1 and the drift layer 7, the depletion layer, made to easily extend, reaches the interface earlier than in an active region 901. This makes the electric field strength at the interface on the sidewall of the inclined trench 12 reach the critical electric field strength by a low applied voltage, before the electric field strength at the interface between the $n^{++}$-type Si semiconductor substrate 1 and the drift layer 7 in the active region 901 rises up to the critical electric field strength to cause breakdown. Thus, only a low breakdown voltage can be obtained.

In comparison, the n-type surface region 9, formed along the sidewall of the inclined trench 12 with a specified dose, can inhibit a depletion layer from spreading on the sidewall. As a result, little electric field concentration is present at the interface between the drift layer 7 and the $n^{++}$-type Si semiconductor substrate 1. Furthermore, spread of a depletion layer on the sidewall of the inclined trench 12 becomes slower than in the inside of the drift layer 7. Thus, the way of spreading a depletion layer is improved so that a breakdown voltage is determined by the critical electric field strength at the interface between the drift layer 7 and the $n^{++}$-type Si semiconductor substrate 1 in the active region 901 rather than the critical electric field strength on the sidewall of the inclined trench 12. As is shown by the dotted line with the indication "TYPE-A", the electric field concentration at the interface between the $n^{++}$-type Si semiconductor substrate 1 and the drift layer 7 on the sidewall of the inclined trench 12 is reduced to cause no breakdown due to the electric field concentration at a junction termination structure 902.

In the semiconductor device disclosed in JP-A-2005-136064 as a related art (present FIG. 23), after the trench for forming the breakdown voltage blocking structure of the main semiconductor device, the manufacturing process steps of the main semiconductor device such as a MOS gate structure must be provided. In comparison, in the present embodiment according to the present invention, after completion of the manufacturing process steps of the main semiconductor device such as a MOS gate structure, the breakdown voltage blocking structure can be formed from the surface opposite to the surface on which the MOS gate structure is formed with the MOS gate structure being protected. Thus, improvement in manufacture yields can be expected. In addition, after the inclined trench (the trench with a taper angle) 12 is filled with the oxide film 10, no manufacturing process is present in which thermal treatment at a high temperature is carried out. This can solve problems occurring due to difference in linear expansion coefficients between the semiconductor layer and the oxide film such as generation of residual stress. Moreover, individual semiconductor devices can be obtained by cutting the semiconductor substrate at the inclined trenches each being filled with a silicon oxide film. Therefore, the edge of a semiconductor device (a chip) is covered with a thick insulator layer to provide high stability and reliability in the breakdown voltage thereof.

In Example 2, explanations will be made about a diode with a breakdown voltage of 600 V and the manufacturing method thereof with an emphasis on the junction termination structure thereof.

Figure 7A:
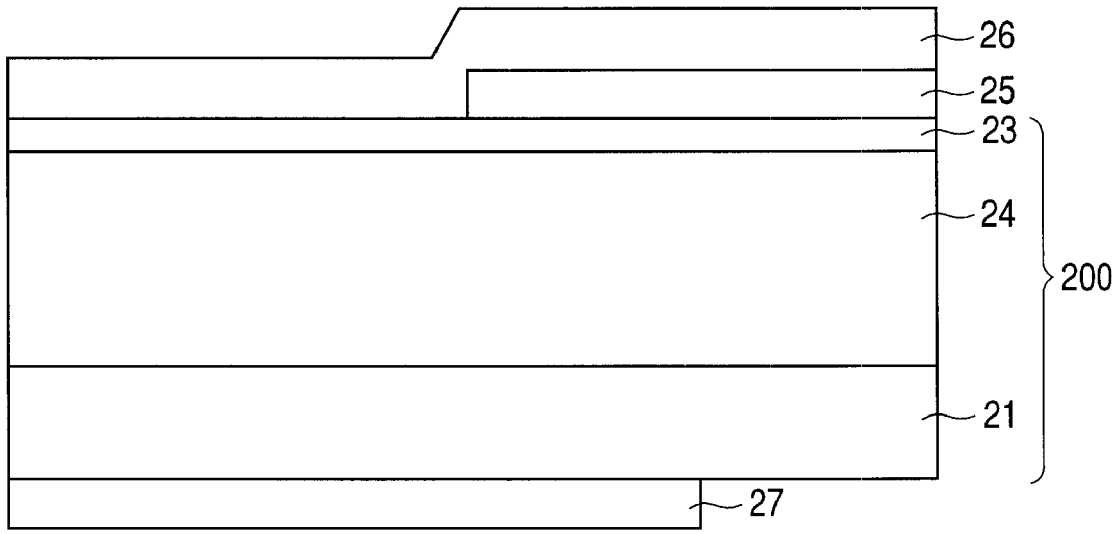
FIG. 7A is a cross-sectional view showing the manufacturing process step next to the step shown in FIG. 6B in which an insulator film and an anode electrode are formed on the epitaxial Si layer side of the semiconductor substrate and an etching mask is formed on the n$^{++}$-type Si semiconductor substrate side.
Figure 7B:
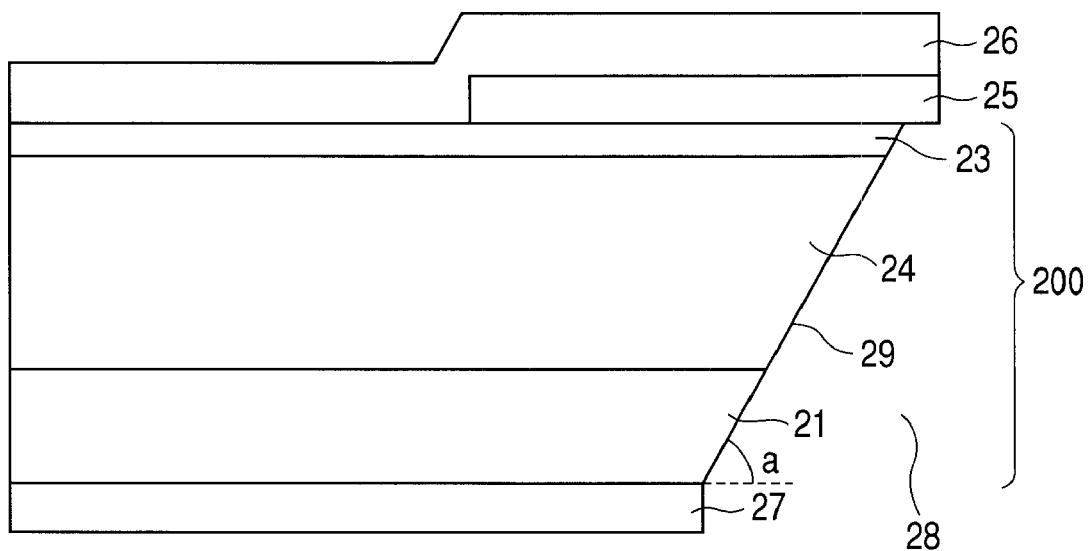
FIG. 7B is a cross-sectional view showing the manufacturing process step next to the step shown in FIG. 7A in which an inclined trench is formed.
Figure 8A:
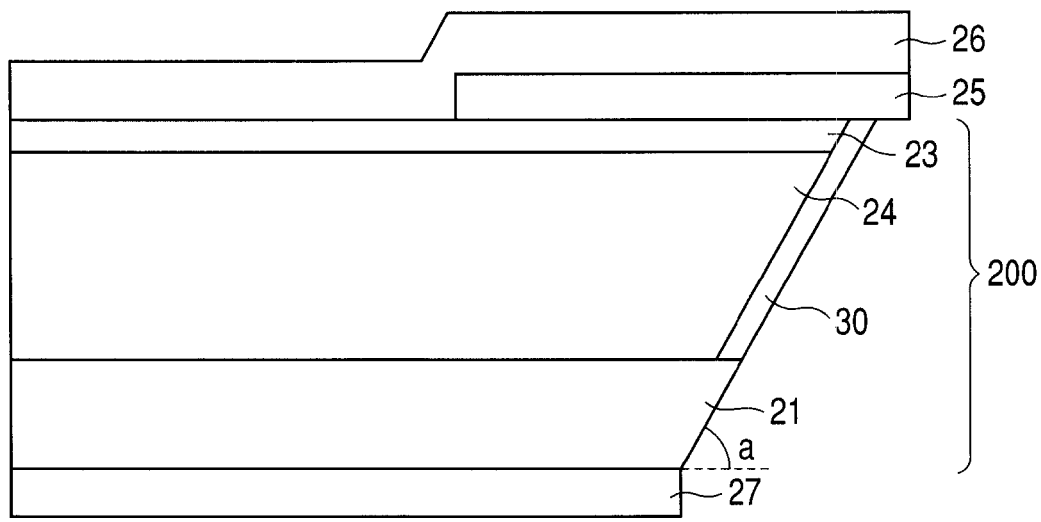
FIG. 8A is a cross-sectional view showing the manufacturing process step next to the step shown in FIG. 7B in which an n-type surface region is formed on the sidewall of the inclined trench.
Figure 8B:
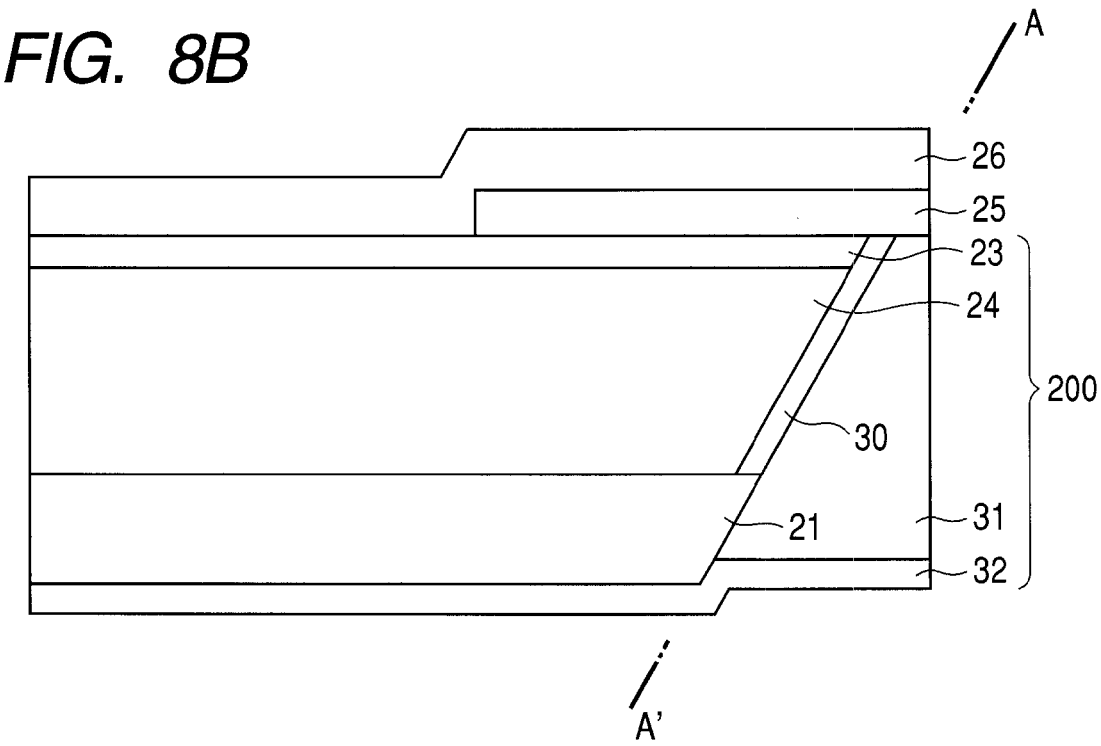
FIG. 8B is a cross-sectional view showing the manufacturing process step next to the step shown in FIG. 8A in which an inclined trench is filled with an oxide film and a metal film for a cathode electrode is formed on the n$^{++}$-type Si semiconductor substrate side of the semiconductor substrate.
Figure 9A:
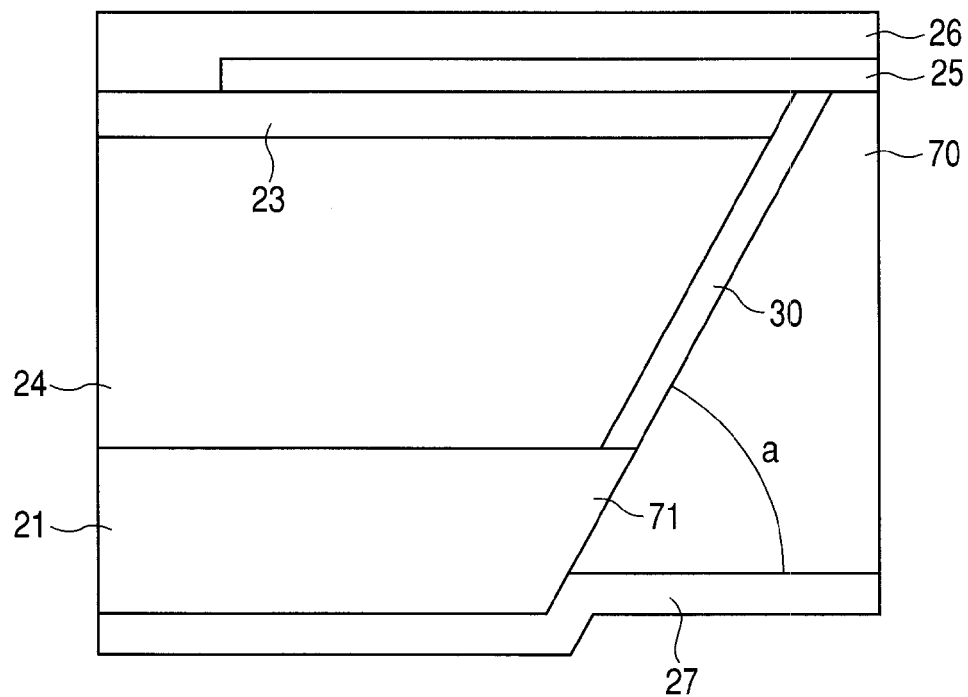
FIG. 9A is a cross-sectional view showing the principal part of the junction termination structure of the diode according to Example 2.
Figure 9B:
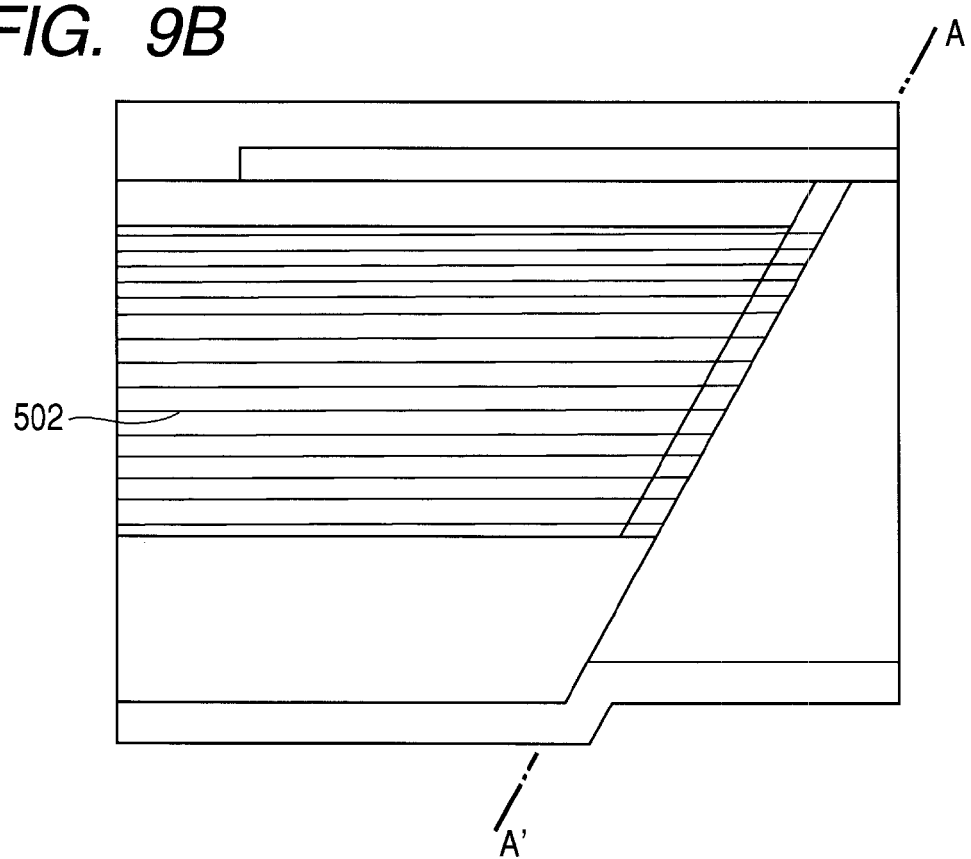
FIG. 9B is a cross-sectional view showing equipotential lines in the junction termination structure shown in FIG. 9A when a reverse bias voltage is applied to the diode.
Figure 10:
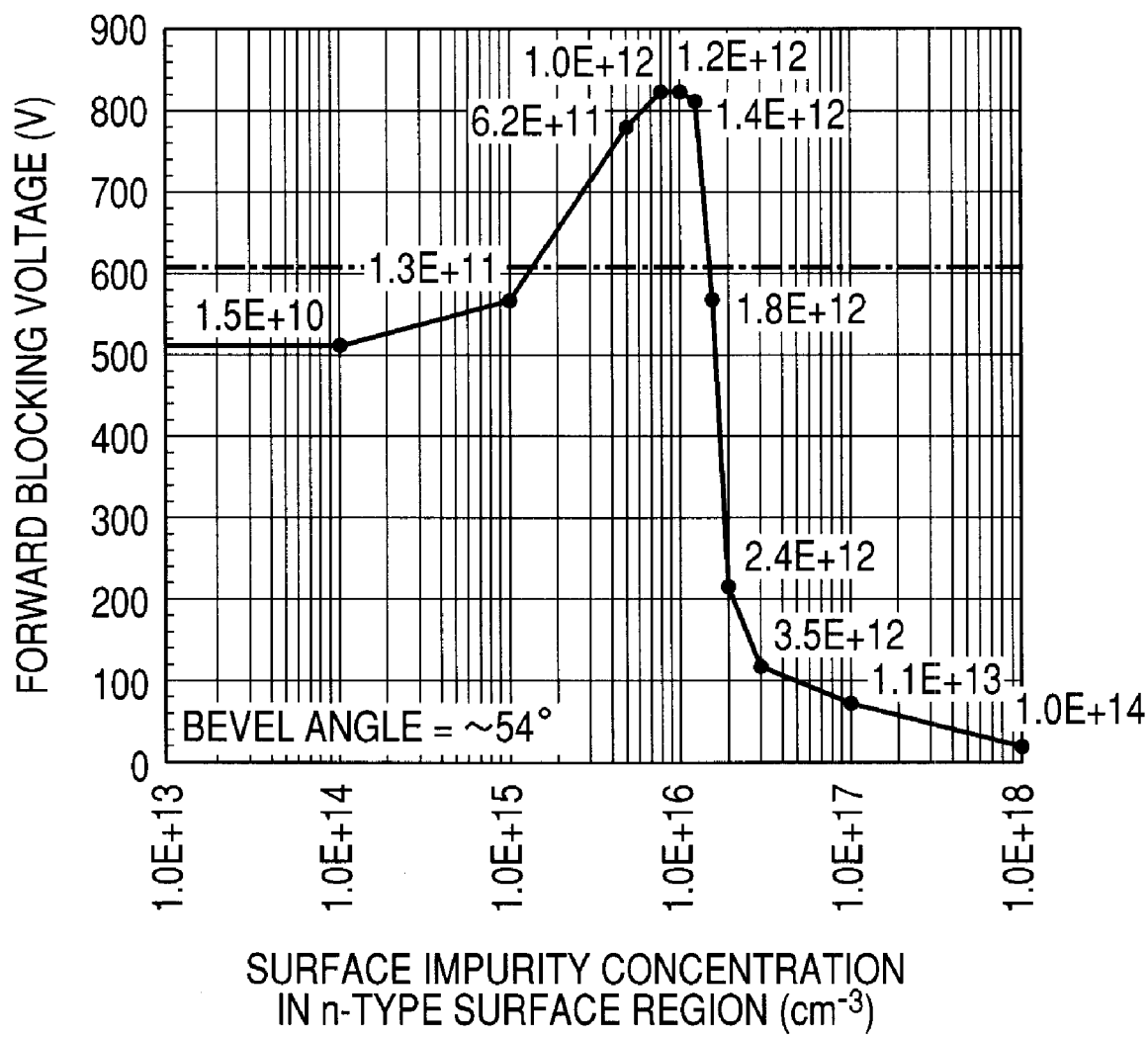
FIG. 10 is a diagram showing the correlation between the surface impurity concentration (dose) in the n-type surface region and the forward blocking voltage about the diode according to Example 2.

FIG. 6A to FIG. 8B are cross-sectional views showing the manufacturing process steps of the diode according to Example 2 about a section around the principal part of the junction termination structure thereof. FIGS. 9A and 9B are a cross-sectional view showing the junction termination structure according to Example 2 and a cross-sectional view showing equipotential lines in the junction termination structure, respectively. FIG. 10 is a diagram showing a correlation between an impurity concentration (a dose) in an n-type surface region and a breakdown voltage in the diode according to Embodiment 2.

Figure 6A:
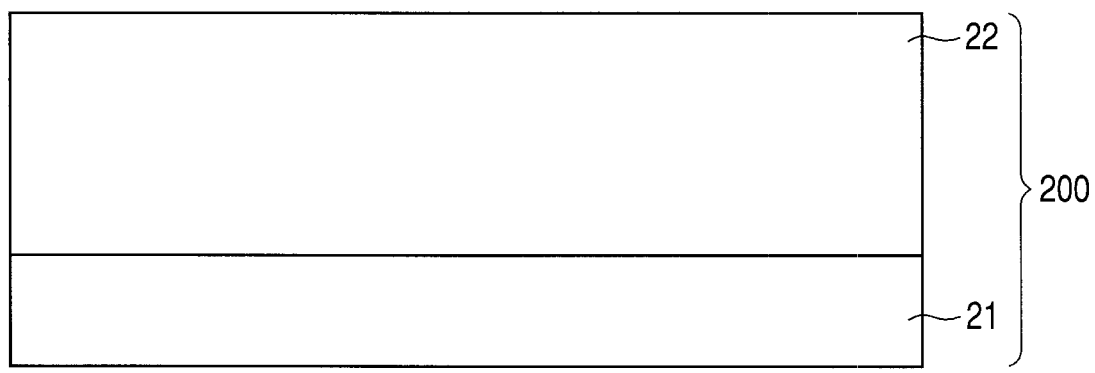
FIG. 6A is a cross-sectional view showing the manufacturing process step of a diode according to Example 2 of a section around the principal part of the junction termination structure thereof in which step a semiconductor substrate having an epitaxial Si layer on an n$^{++}$-type Si semiconductor substrate is formed.
Figure 6B:
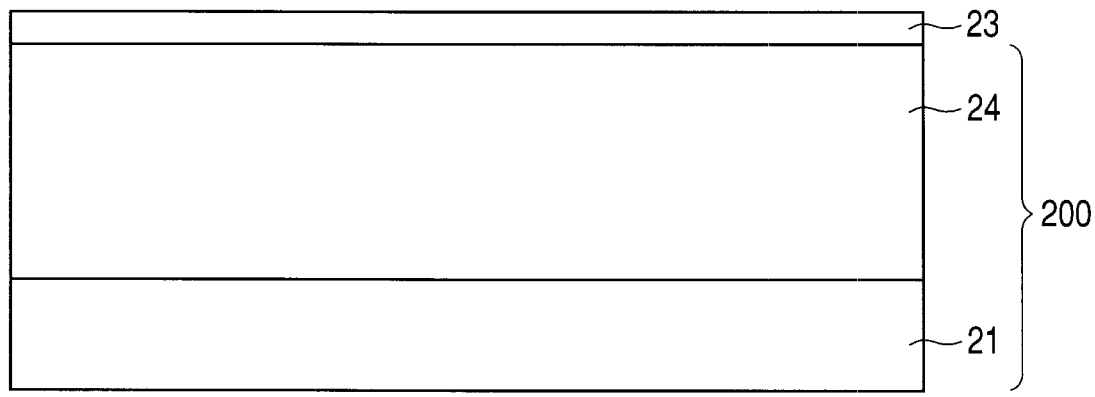
FIG. 6B is a cross-sectional view showing the manufacturing process step next to the step shown in FIG. 6A in which a p$^+$ anode layer is formed on the epitaxial Si layer to be a drift layer.

As shown in FIG. 6A, on an $n^{++}$-type Si semiconductor substrate 21 with the direction of crystal plane of the principal surface thereof being (100) and with a sufficiently high impurity concentration, an $n^{-}$-type epitaxial Si layer 22 with a low impurity concentration is formed by epitaxial growth. The substrate having the $n^{-}$-type epitaxial Si layer 22 on the $n^{++}$-type Si semiconductor substrate 21 is provided as a semiconductor substrate 200. On the principal surface on the $n^{-}$-type epitaxial Si layer 22 side of the semiconductor substrate 200, ion implantation with boron ions is selectively carried out. The implanted boron ions are then subjected to driving diffusion at 110° C., by which a $p^{+}$ anode layer 23 is formed with a thickness of 3 μm. The rest of the $n^{-}$-type epitaxial Si layer 22 becomes a drift layer 24 (FIG. 6B). On the principal surface on the $n^{-}$-type epitaxial Si layer 22 side of the semiconductor substrate 200, an insulator film 25 and an anode electrode 26 are formed. Further, specified process steps of forming a diode such as the step of forming unillustrated passivation film are carried out.

Thereafter, the semiconductor substrate 200 is thinned from the $n^{++}$-type Si semiconductor substrate 21 side to a specified thickness (100 μm). Then, an etching mask 27 is formed for forming an inclined trench penetrating through the semiconductor substrate 200 from the principal surface on the $n^{++}$-type Si semiconductor substrate 21 side to the $p^{+}$ anode layer 23. The etching mask 27 is formed on the principal surface on the $n^{++}$-type Si semiconductor substrate 21 side with the pattern thereof made to correspond to the pattern of the principal surface on the $p^{+}$ anode layer 23 side by using a double sided mask aligner (FIG. 7A). Thereafter, anisotropic etching is carried out from the $n^{++}$-type Si semiconductor substrate 21 side to expose the (111) plane. In this way, with the (111) plane taken as a sidewall 29, a v-shaped inclined trench 28 is formed, which surrounds the outer periphery of the active region with a taper angle "a" being approximately 54° (FIG. 7B). At this time, the taper angle "a" is preferably provided so that the inclined trench 28 with the taper angle is formed to have a shape with which the width of the bottom of the inclined trench 28 is narrower than the opening width thereof. This makes the positive (acute) bevel angle provided as being 54°.

Next, n-type dopant ions are introduced into the sidewall 29 of the inclined trench 28 by ion implantation with a specified amount of phosphorus ions, which implantation is carried out in the direction perpendicular to the principal surface of the $n^{++}$-type Si semiconductor substrate 21. Furthermore, the introduced dopant ions are activated by furnace annealing at a temperature equal to or less than 500° C. or by laser annealing so as not to thermally damage a diode structure to form an n-type surface region 30 with a surface impurity concentration of the order of $1.0 \times 10^{16}$ cm$^{3}$ and a diffusion depth of 0.3 μm (FIG. 8A). Moreover, an oxide film 31 such as SOG (Spin-On-Glass) to be provided by application is formed on the entire surface of the semiconductor substrate 200 so as to fill the inclined trench 28. Then, by carrying out whole surface wet etching, the principal surface of the $n^{++}$-type Si semiconductor substrate 21 is exposed with the V-shaped inclined trench 28 filled with the oxide film 31. Thereafter, a metal film 32 for a cathode electrode is formed by evaporation or sputtering to bring the diode to completion (FIG. 8B).

The drift layer 24 of the semiconductor substrate 200 is formed with an impurity concentration of approximately $1.0 \times 10^{13}$ cm$^{-3}$ and a thickness of the order of 60 μm. This makes the depletion layer in the active region reach the $n^{++}$-type Si semiconductor substrate 21 with a voltage lower than the maximum applicable voltage to the semiconductor device (hereinafter referred to as the "breakdown voltage"). FIGS. 9A and 9B are a cross-sectional view showing the principal part of the junction termination structure of the diode according to Example 2 and a cross-sectional view showing equipotential lines 502 in the junction termination structure when a reverse bias voltage is applied to the diode. At the end of the termination structure having an angle of approximately 54° to the principal surface of the $n^{++}$-type Si semiconductor substrate 21, equipotential surfaces become perpendicular to the sidewall and the extent of spread of the depletion layer is proportional to a reciprocal of sine of an inclination angle of the side wall. Therefore, the depletion layer reaches the $n^{++}$-type Si semiconductor substrate 21 with a voltage lower than the voltage in the active region.

Electric field strength distributions along line A-A' of FIG. 9B when a reverse bias voltage is applied to the diode according to Example 2 are also schematically shown in a diagram of FIG. 1. The notations in the diagram have the same meaning as those for Example 1. In FIG. 1, the region with a notation "$n^{-}$" on the horizontal axis corresponds to the drift layer 24.

In the $n^{++}$-type Si semiconductor substrate 21 with a high impurity concentration, a depletion layer cannot spread easily. Thus, when no n-type surface region 30 is provided, electric field strength increases at the interface between the drift layer 24 and the $n^{++}$-type Si semiconductor substrate 21 around the inclined trench 28 ("TYPE-B" in FIG. 1). This makes the electric field strength around the sidewall of the inclined trench 28 reach the critical electric field strength by a low applied voltage to cause breakdown before the electric field strength at the p-n main junction in the active region rises up to the critical electric field strength. Thus, only a low breakdown voltage can be obtained.

In contrast, in the diode according to Example 2 in which the n-type surface region 30 is formed on the sidewall of the inclined trench 28 with a specified dose with an extent of causing depletion, a depletion layer can be inhibited from spreading in the sidewall section. As a result, in the electric field strength distribution in the sidewall section, the electric field concentration is reduced as is shown by the dotted line with the indication of "TYPE-A" in FIG. 1 to make avalanche breakdown due to the electric field concentration difficult to occur at a junction termination structure.

In FIG. 10, the correlation between the surface impurity concentration in the n-type surface region 30 and the forward blocking voltage is shown about the diode with the taper angle "a" (referred to as "bevel angle" in FIG. 10) of the sidewall being approximately 54°. In the diagram, a numeric value attached to each of dots shows a dose for obtaining a corresponding impurity concentration when phosphorus ions are implanted in the direction perpendicular to the principal surface of the semiconductor substrate 200. From FIG. 10, it is known that there is a preferable range in the surface impurity concentration in the region 30 and the dose therefor. Namely, for the forward blocking voltage of 600 V or more, the range between $1.4 \times 10^{15}$ cm$^{-3}$ and $1.7 \times 10^{16}$ cm$^{-3}$ is preferable for the surface impurity concentration and the range between $6.2 \times 10^{11}$ cm$^{-2}$ and $1.4 \times 10^{12}$ cm$^{-2}$ is preferable for the dose.

In Example 3, explanations will be made about a diode with a breakdown voltage of 600 V and the manufacturing method thereof with an emphasis on the junction termination structure thereof.

Figure 12A:
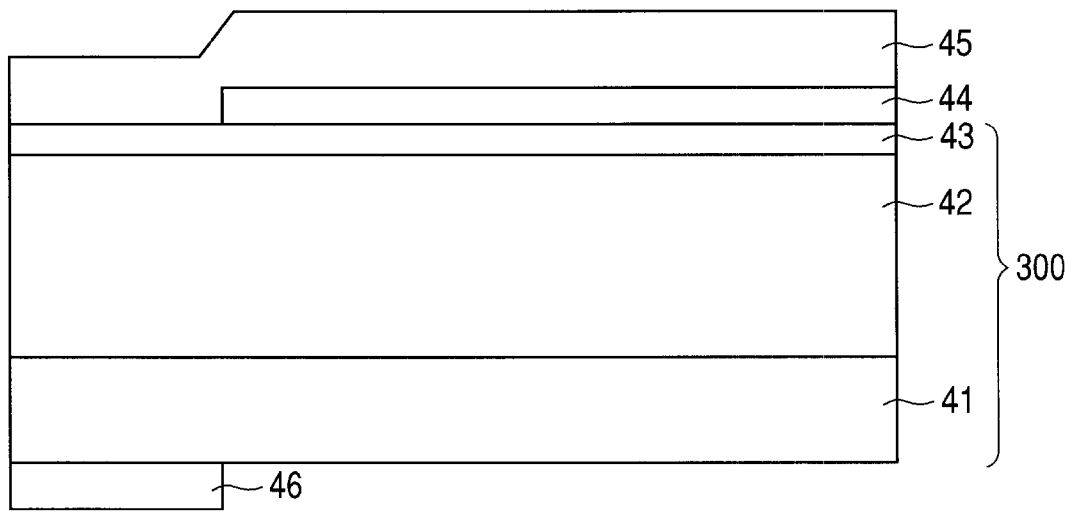
FIG. 12A is a cross-sectional view showing the manufacturing process step next to the step shown in FIG. 11B in which a silicon oxide film and an anode electrode are formed on the epitaxial Si layer side of the semiconductor substrate and an etching mask is formed on the n$^{++}$-type Si semiconductor substrate side.
Figure 12B:
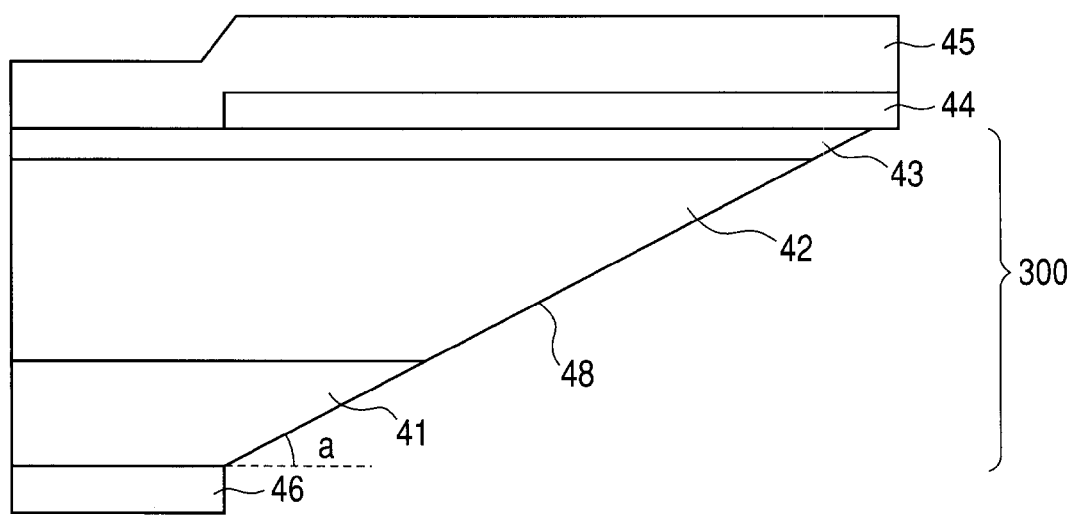
FIG. 12B is a cross-sectional view showing the manufacturing process step next to the step shown in FIG. 12A in which an inclined trench is formed.
Figure 13A:
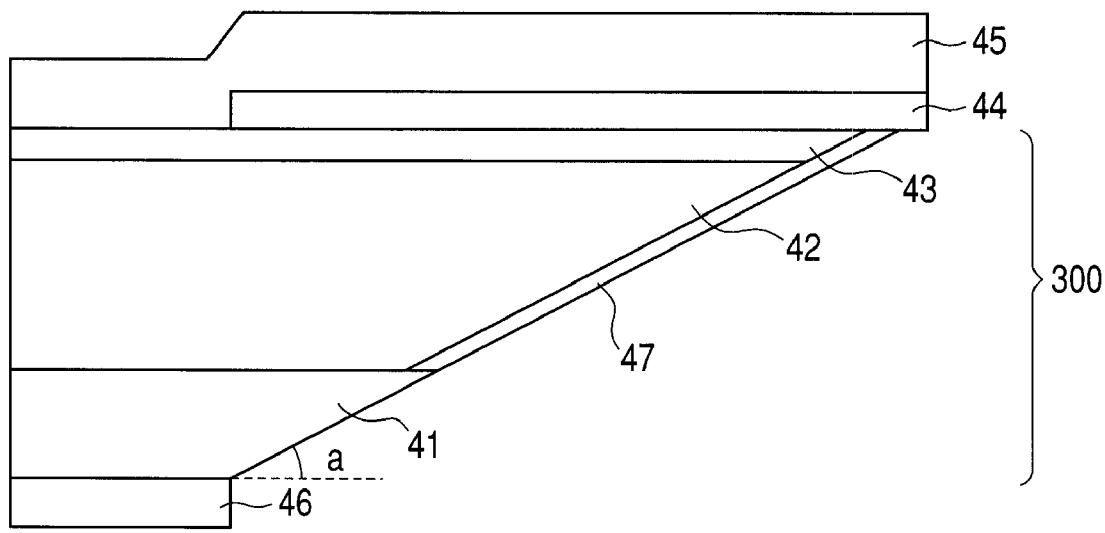
FIG. 13A is a cross-sectional view showing the manufacturing process step next to the step shown in FIG. 12B in which an n-type surface region is formed on the sidewall of the inclined trench.
Figure 13B:
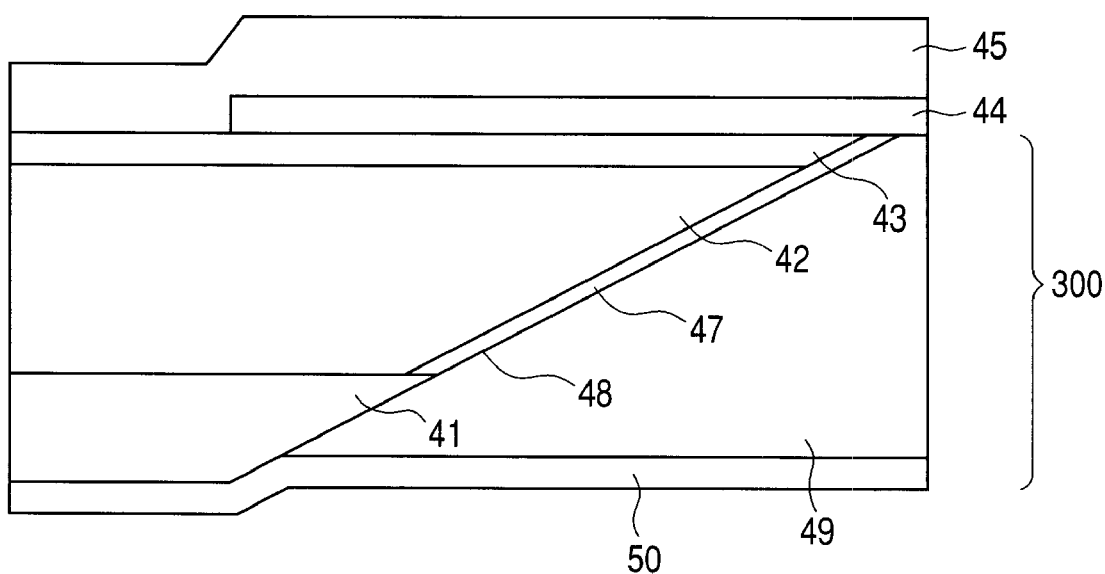
FIG. 13B is a cross-sectional view showing the manufacturing process step next to the step shown in FIG. 13A in which an inclined trench is filled with an oxide film and a metal film for a cathode electrode is formed on the n$^{++}$-type Si semiconductor substrate side of the semiconductor substrate.
Figure 14:
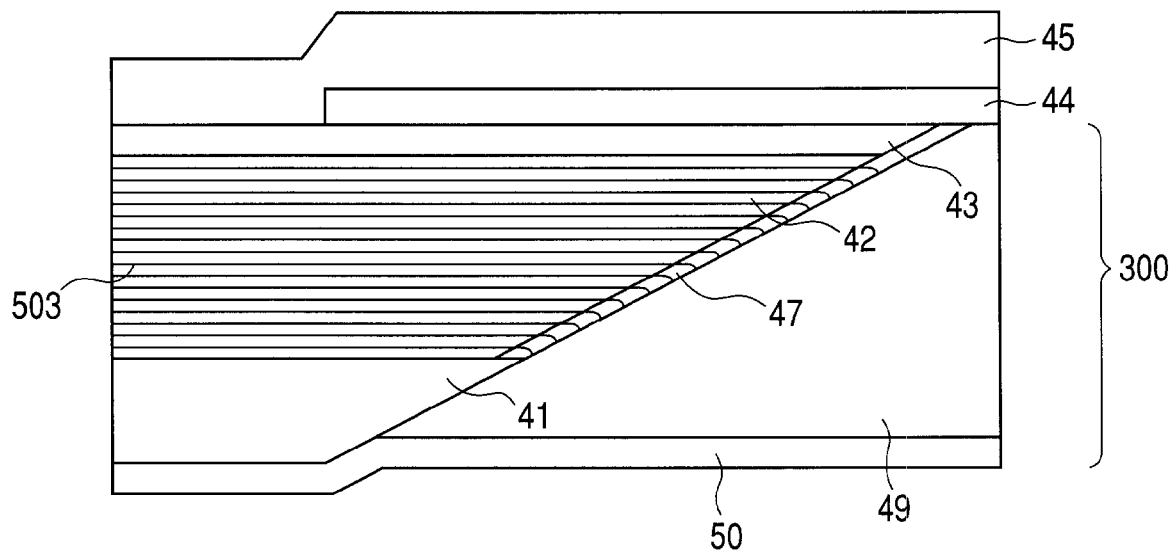
FIG. 14 is a cross-sectional view showing the principal part of the junction termination structure of the superjunction MOSFET according to Example 3 with additionally drawn equipotential lines when a reverse bias voltage is applied.
Figure 15:
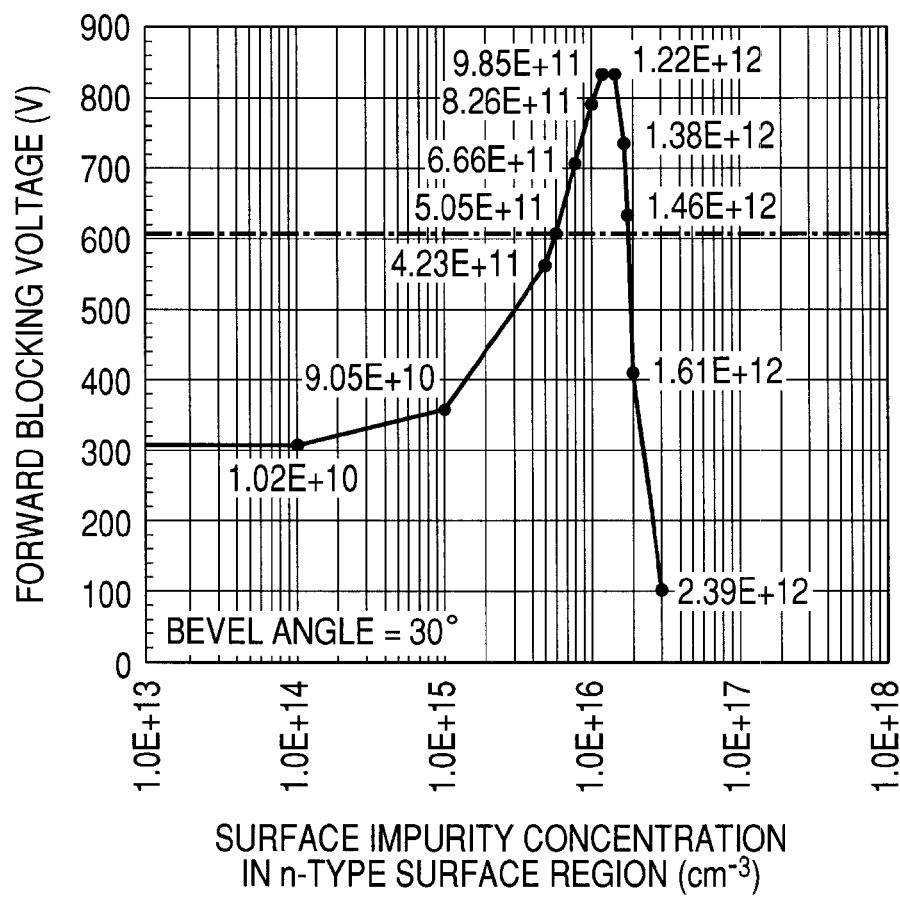
FIG. 15 is a diagram showing the correlation between the surface impurity concentration (dose) in the n-type surface region and the forward blocking voltage about the diode according to Example 3.

FIG. 11A to FIG. 13B are cross-sectional views showing manufacturing process steps of the diode according to Example 3 about a section around the principal part of the junction termination structure thereof. FIG. 14 is a cross-sectional view showing equipotential lines in the junction termination structure according to Example 3. FIG. 15 is a diagram showing a correlation between the impurity concentration (dose) in an n-type surface region and the forward blocking voltage in the diode according to Embodiment 3.

Figure 11A:
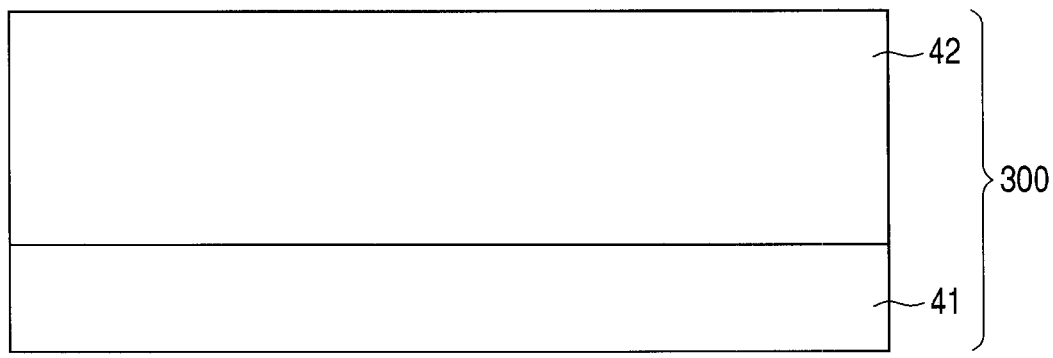
FIG. 11A is a cross-sectional view showing the manufacturing process step of a diode according to Example 3 of a section around the principal part of the junction termination structure thereof in which step a semiconductor substrate having an epitaxial Si layer on an n$^{++}$-type Si semiconductor substrate is formed.
Figure 11B:
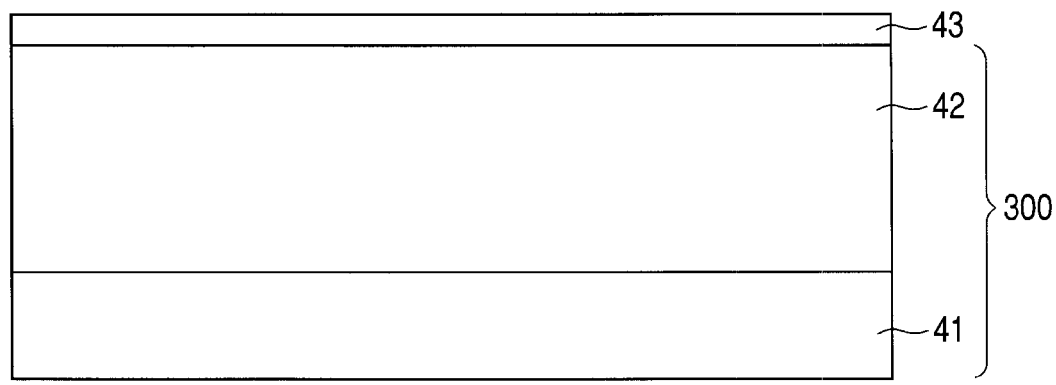
FIG. 11B is a cross-sectional view showing the manufacturing process step next to the step shown in FIG. 11A in which a p-type anode layer is formed on the epitaxial Si layer.

First, an $n^{++}$-type Si semiconductor substrate 41 is prepared in which the direction of crystal plane of the principal surface thereof is (100) and an impurity concentration is sufficiently high. On the substrate 41, as shown in FIG. 11A, an $n^-$-type epitaxial Si layer 42 with a relatively low impurity concentration is formed by deposition. The substrate having the $n^-$-type epitaxial Si layer 42 on the $n^{++}$-type Si semiconductor substrate 41 is provided as a semiconductor substrate 300. On the principal surface on the $n^-$-type epitaxial Si layer 42 side of the semiconductor substrate 300, a p-type anode layer 43, a silicon oxide film 44, and an anode electrode 45 are formed in the order (FIG. 11B and FIG. 12A). Furthermore, process steps necessary for forming a diode such as the step of forming unillustrated passivation film are carried out. In the process steps for forming the diode, the silicon oxide film 44 is formed on the surface of the junction termination structure of the semiconductor substrate 300. Thereafter, like in Examples 1 and 2, the semiconductor substrate 300 is polished to be thinned from the $n^{++}$-type Si semiconductor substrate 41 side to a specified thickness (70 μm). Then, an etching mask 46 is formed for forming an inclined trench penetrating through the semiconductor substrate 300 from the principal surface on the $n^{++}$-type Si semiconductor substrate 41 side to the opposite principal surface on the $n^-$-type epitaxial Si layer 42 side. The etching mask 46 is formed on the principal surface on the $n^{++}$-type Si semiconductor substrate 41 side with the pattern thereof made to correspond to the pattern of the principal surface on the $n^{++}$-type Si semiconductor substrate 41 side by using a double sided mask aligner (FIG. 12A).

Thereafter, by employing well-known technologies such as a Si etching technology and a trench forming technology, an inclined trench 48 is formed by carrying out etching from the $n^{++}$-type Si semiconductor substrate 41 side. The inclined trench 48 has a v shape or a trapezoidal shape with a taper angle and surrounds the outer periphery of the active region. At this time, the taper angle "a" is preferably provided so that the inclined trench 48 is formed to have a shape with which the width of the bottom of the inclined trench 48 is narrower than the opening width thereof (FIG. 12B). In Example 3, the taper angle "a" is approximately 30° and the sidewall of the inclined trench 48 forms a positive (acute) bevel angle to the principal surface of the semiconductor substrate.

Next, ion implantation with a specified amount of phosphorus ions is carried out into the sidewall of the inclined trench 48 in the direction perpendicular to the principal surface of the $n^{++}$-type Si semiconductor substrate 41. Furthermore, the introduced dopant ions are activated by furnace annealing at a temperature equal to or less than 500° C. or by laser annealing so as not to thermally damage a diode structure to form an n-type surface region 47 with a surface impurity concentration of the order of $1.0 \times 10^{16}$ cm$^{-3}$ (FIG. 13A). Moreover, a silicon oxide film 49 such as SOG (Spin-On-Glass) to be provided by application is formed on the entire surface of the semiconductor substrate 300 so as to fill the inclined trench 48. Then, by carrying out entire surface wet etching, the silicon oxide film 49 is removed except the filling in the inclined trench 48. This makes the principal surface of the $n^{++}$-type Si semiconductor substrate 41 side exposed with the V-shaped inclined trench 48 being filled with the silicon oxide film 49. After this, a metal film for a cathode electrode 50 is formed by evaporation or sputtering to bring the diode to completion (FIG. 13B).

FIG. 14 is a cross-sectional view showing the principal part of the junction termination structure of the diode with additionally drawn equipotential lines 503 when a reverse bias voltage is applied to the diode. Compared with the diode shown in FIG. 14, in a diode without the n-type surface region 47 being formed, when a voltage is applied between the anode electrode 45 and the cathode electrode 50 so that the voltage is higher on the cathode electrode 50 side, i.e., when a reverse bias voltage is applied to the p-n main junction, on the sidewall surface of the inclined trench 48 having the positive bevel angle of approximately 30°, equipotential surfaces become perpendicular to the sidewall. This causes the electric field intensity at the interface between the $n^{++}$-type Si semiconductor substrate 41 and the drift layer 42 to abruptly become high as is shown by the solid line with the indication "TYPE-B" in FIG. 1. As a result, the electric field strength around the sidewall of the inclined trench 48 is made to reach the critical electric field strength by a low applied voltage to cause breakdown before the electric field strength at the p-n main junction in the active region rises up to the critical electric field strength. Thus, only a low breakdown voltage can be obtained.

In contrast, in the diode according to Example 3 in which the n-type surface region 47 is formed on the sidewall of the inclined trench 48 with a specified dose with an extent of causing depletion, a depletion layer can be inhibited from spreading in the sidewall section. As a result, in the electric field strength distribution in the sidewall section, electric field concentration is reduced as is shown by the dotted line with the indication of "TYPE-A" in FIG. 1 to make avalanche breakdown due to the electric field concentration difficult to occur at a junction termination structure.

In FIG. 15, the correlation between the surface impurity concentration in the n-type surface region 47 and the forward blocking voltage is shown about the diode with the taper angle "a" (referred to as "bevel angle" in FIG. 15) of the sidewall being approximately 30°. In the diagram, a numeric value attached to each of dots shows a dose for obtaining a corresponding impurity concentration when phosphorus ions are implanted in the direction perpendicular to the principal surface of the semiconductor substrate 300. From FIG. 15, it is known that there is a preferable range in the surface impurity concentration in the region 47 and the dose therefor. Namely, for the forward blocking voltage of 600 V or more, the range between $6 \times 10^{15}$ cm$^{-3}$ and $1.9 \times 10^{16}$ cm$^{-3}$ is preferable for the surface impurity concentration and the range between $5.0 \times 10^{11}$ cm$^{-2}$ and $1.6 \times 10^{12}$ cm$^{-2}$ is preferable for the dose.

In the foregoing, explanations were made about the case of the diode for which the $n^-$-type epitaxial Si layer 42 is used. In Example 4, explanations will be made about a superjunction MOSFET and the manufacturing method thereof with an emphasis on the junction termination structure thereof.

Figure 16A:
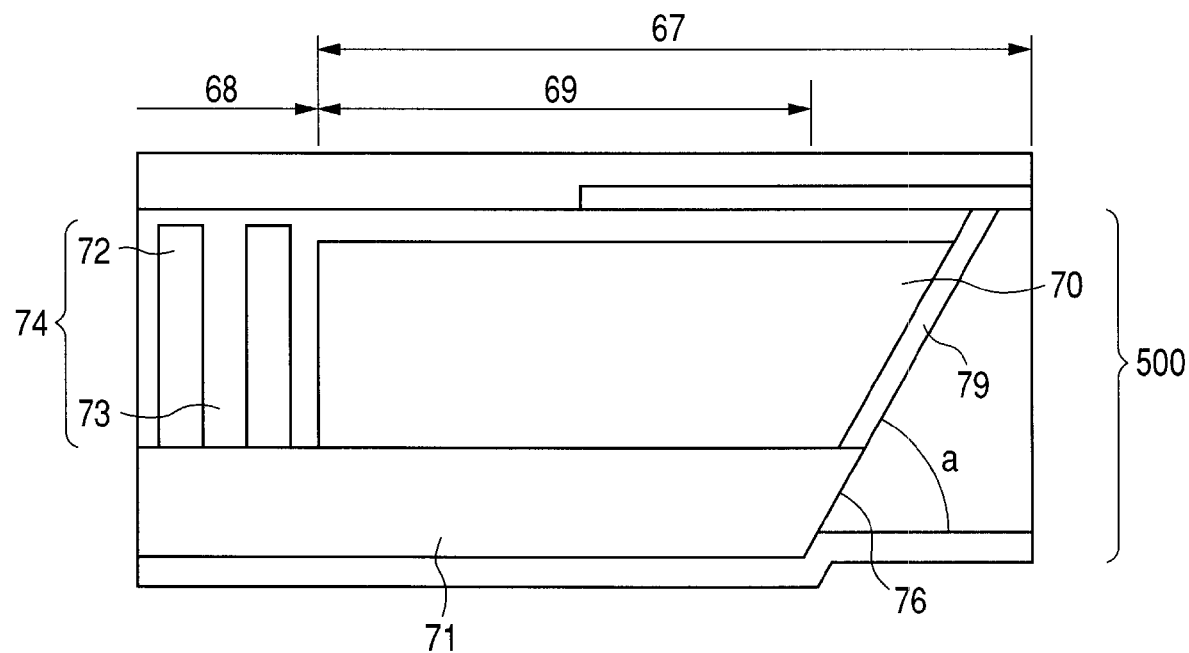
FIG. 16A is a cross-sectional view showing the principal part of the junction termination structure of a superjunction MOSFET according to Example 4 according to the present invention.
Figure 16B:
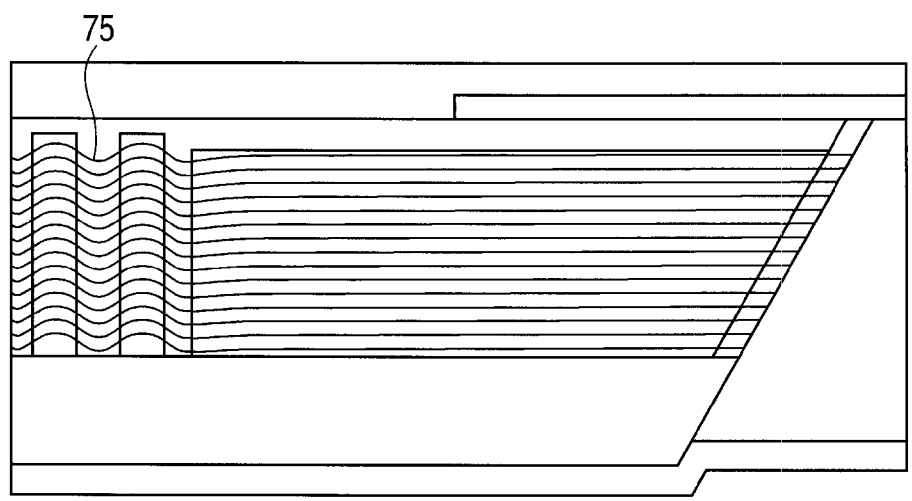
FIG. 16B is a cross-sectional view showing equipotential lines in the junction termination structure shown in FIG. 16A when a reverse bias voltage is applied to the superjunction MOSFET.

FIGS. 16A and 16B are a cross-sectional view showing the principal part of the junction termination structure of the superjunction MOSFET according to Example 4 and a cross-sectional view showing equipotential lines in the junction termination structure, respectively. In the view, reference numerals 68 and 67 denote an active region and a junction termination structure formed around the outer periphery of the active region, respectively. The superjunction MOSFET according to Example 4 is common to the diode according to Example 2 in that the impurity concentration in the drift layer in the junction termination structure is the same level as that of the diode. The superjunction MOSFET according to Example 4 is different from the diode according to Example 2 in that the semiconductor device according to Example 4 has a superjunction structure 74 in a drift layer 70 in the active region 68 and that the device is a MOSFET. In Example 4, the drift layer 70 has a drift region in the junction termination structure 67 and a drift region in the active region. In addition to the superjunction structure 74, the superjunction MOSFET according to Example 4 is provided with the junction termination structure 67 and further has the drift region in the junction termination structure 67 in a semiconductor substrate 500. The superjunction structure 74 is formed with pin stripe n-type regions 72 and pin stripe p-type isolating regions 73, both formed on an $n^{++}$-type Si semiconductor substrate 71 as the drift region in the active region. The junction termination structure 67 is on the outer periphery of the superjunction structure 74 and includes an inclined trench 76. The drift region in the junction termination structure is provided in the drift layer 70 between the inclined trench 76 and the superjunction structure 74 without the superjunction structure 74. The superjunction structure 74 and the MOS gate structure are formed like those in Example 1.

FIG. 16B is a cross-sectional view showing equipotential lines 75 additionally drawn in the superjunction structure 74 and the junction termination structure 67 in the cross-sectional view of the principal part of the junction termination structure shown in FIG. 16A. In Example 4, only the region in the active region corresponding to the drift region in the active region 68 is formed as the superjunction structure 74. Therefore, the equipotential lines 75 become wave-like in the region of the superjunction structure 74. In comparison, in the region in the junction termination structure of the junction termination structure 67, there is no difference between the equipotential lines 75 and the equipotential lines 502 in Example 2.

Both of the pin stripe n-type region 72 and the pin stripe p-type isolating region 73 forming the superjunction structure 74 are formed with impurity concentrations of approximately $4.5 \times 10^{15}$ cm$^{-3}$. Moreover, the drift region in the junction termination structure of the junction termination structure 67 is formed as being the n-type with an impurity concentration of the order of $1.0 \times 10^{13}$ cm$^{-3}$. Since the drift layer 70 is thin like that in Example 2, the depletion layers in the active region 68 and the drift region in the junction termination structure reach the $n^{++}$-type Si semiconductor substrate 71 with a voltage lower than the design breakdown voltage of the semiconductor device, i.e., the maximum applied voltage.

At this time, with a related breakdown voltage blocking structure, electric field strength rises at an interface between a drift layer around a sidewall surface and an $n^{++}$-type Si semiconductor substrate. In Example 4, however, there is the drift region in the junction termination structure having lower concentration than that of the drift region in the junction termination structure of the junction termination structure 67. In addition, at the end of the junction termination structure 67, the sidewall surface of the inclined trench 76 has a taper angle "a" of approximately 54° and an n-type surface region 79 is formed on the sidewall surface with a surface impurity concentration of $1.0 \times 10^{16}$ cm$^{-3}$ like that in Example 2. Thus, no depletion layer reaches the interface between the drift layer 70 and the $n^{++}$-type Si semiconductor substrate 71 around the sidewall before the depletion layer in the active region 68 reaches the interface. Since the depletion layer first reaches the $n^{++}$-type Si semiconductor substrate 71 in the active region 68, an applied voltage raised up to the design breakdown voltage at the interface between the superjunction structure 74 and the $n^{++}$-type Si semiconductor substrate 71 brings the voltage in the semiconductor device to the critical voltage thereof to cause breakdown.

The n-type surface region 79 formed along the sidewall of the inclined trench 76 with a specified dose with an extent of causing depletion can inhibit the depletion layer from spreading in the sidewall section. As a result, the electric field strength distribution in the sidewall surface is improved to cause no avalanche breakdown on the sidewall surface of the inclined trench 76.

In the semiconductor device according to Example 4, the drift layer 70 has the drift region in the junction termination structure, having no superjunction structure, between the superjunction structure 74 and the inclined trench 76. Therefore, as shown in FIG. 16B, no disorder in the electric field distribution and no electric field concentration are produced around the sidewall of the inclined trench 76. As a result, the relationship between the impurity concentration and the forward blocking voltage in the n-type surface region 79 in Example 4 is the same as that shown in FIG. 10 about Example 2.

Figure 17A:
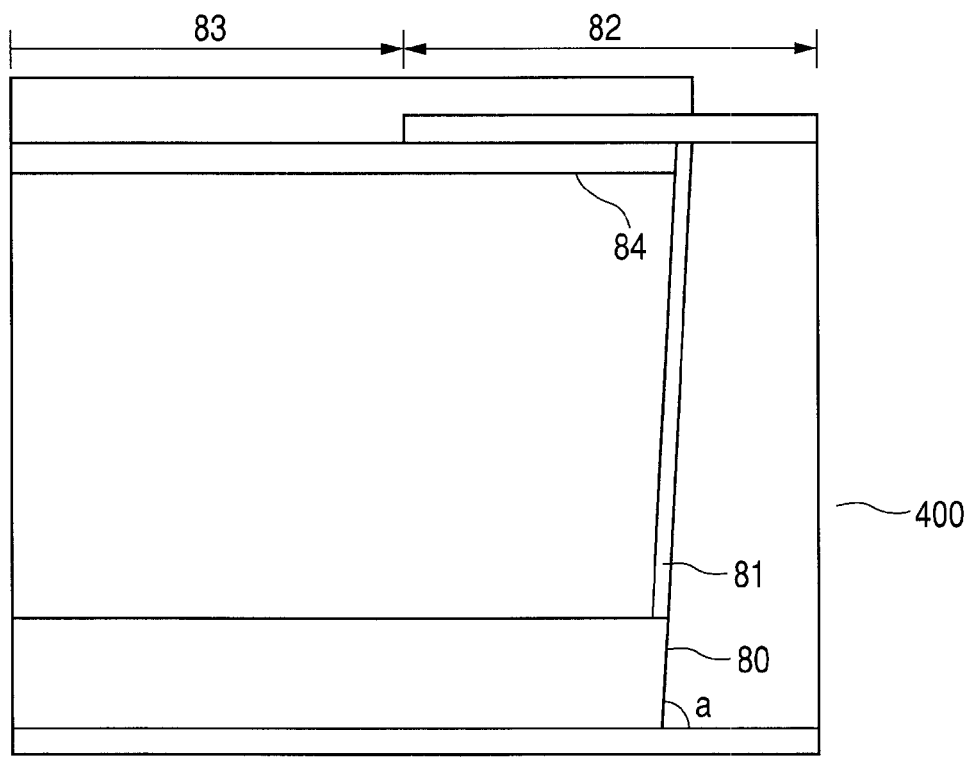
FIG. 17A is a cross-sectional view showing the principal part of the junction termination structure of a MOSFET according to Example 5 according to the present invention.
Figure 17B:
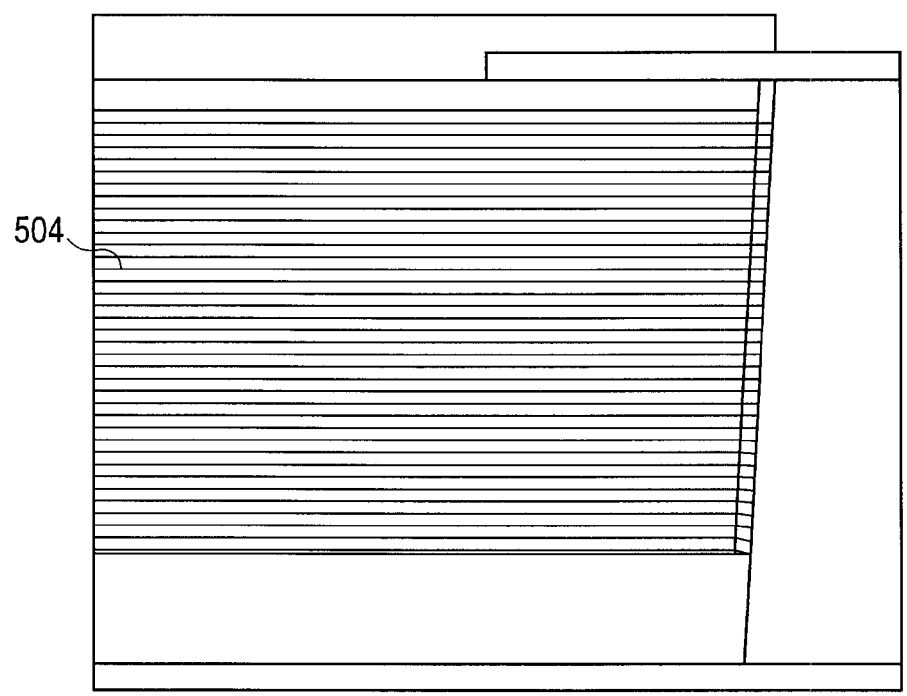
FIG. 17B is a cross-sectional view showing equipotential lines in the junction termination structure shown in FIG. 17A when a reverse bias voltage is applied to the MOSFET.

In Example 5, explanations will be made about a MOSFET with an emphasis on the junction termination structure thereof. FIGS. 17A and 17B are a cross-sectional view showing the principal part of the junction termination structure of the MOSFET according to Example 5 and a cross-sectional view showing equipotential lines in the junction termination structure, respectively.

The MOSFET according to Example 5 has an inclined trench 80 with a taper angle "a" of 85° provided as a positive bevel angle. The MOSFET according to Example 5 is common to the superjunction MOSFET according to Example 1 or Example 4 in the manufacturing method and in that the inclined trench forms a positive bevel angle. While, the MOSFET according to Example 5 is different from the latter superjunction MOSFET according to Example 1 or Example 4 in that the taper angle "a" of the former is 85°.

Figure 18:
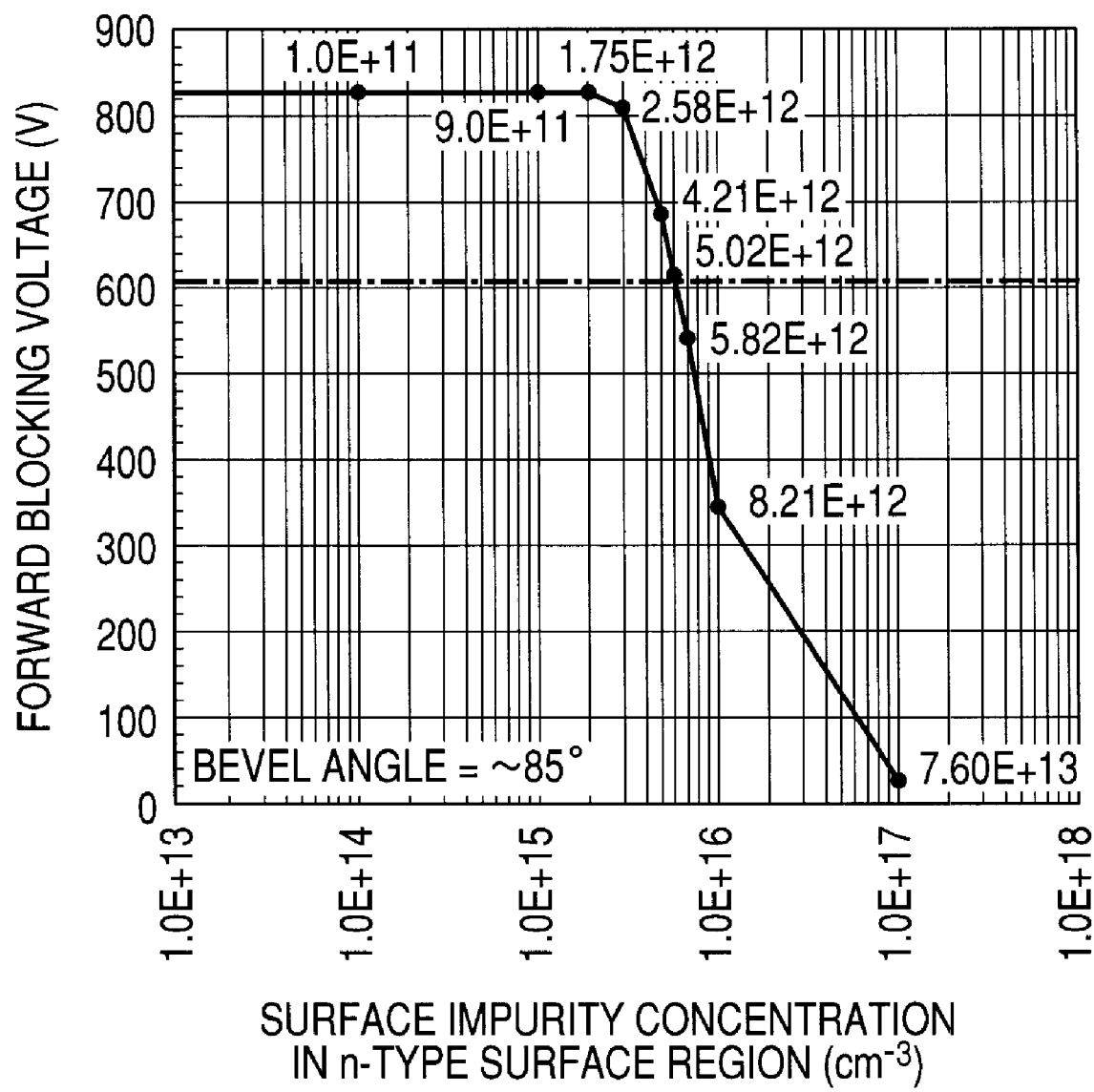
FIG. 18 is a diagram showing the correlation between the surface impurity concentration (dose) in the n-type surface region and the forward blocking voltage about the MOSFET according to Example 5.

FIG. 17B is a cross-sectional view showing the principal part of the junction termination structure of the MOSFET with additionally drawn equipotential lines 504 when a reverse bias voltage is applied to the MOSFET. FIG. 18 is a diagram showing a correlation between the surface impurity concentration in an n-type surface region 81 along the sidewall of the inclined trench 80 and the forward blocking voltage about the MOSFET. In the diagram, a numeric value attached to each of dots shows a dose for obtaining a corresponding impurity concentration when phosphorus ions are implanted in the direction perpendicular to the principal surface of a semiconductor substrate 400. From FIG. 15, it is known that there is a preferable range in the surface impurity concentration in the region 81 and the dose therefor. Namely, for the forward blocking voltage of 600 V or more, the range of $6.0 \times 10^{15}$ cm$^{-3}$ or less is preferable for the surface impurity concentration and the range of $5.0 \times 10^{12}$ cm$^{-2}$ or less is preferable for the dose.

In the MOSFET according to Example 4, the taper angle "a" is 85°, which is close to 90° to make the depletion layer spread on the sidewall surface of the inclined trench 80 in a way with little difference from the way inside. The surface impurity concentration in the n-type surface region 81 higher than $6.0 \times 10^{15}$ cm$^{-3}$ increases the difference from the inside impurity concentration ($1.0 \times 10^{13}$ cm$^{-3}$) to make the depletion layer spread on the sidewall surface of the inclined trench 80 in a way smaller than the way inside. As a result, it is considered that on the sidewall surface, in a section other than the interface between a substrate and a drift layer, electric field strength reaches the critical electric field strength prior to the electric field strength inside to cause breakdown there.

That is, for a taper angle "a" close to 90°, it is preferable that a difference in impurity concentration between in the n-type surface region and inside is small. A large difference sometimes causes reduction in breakdown voltage.

Figure 19A:
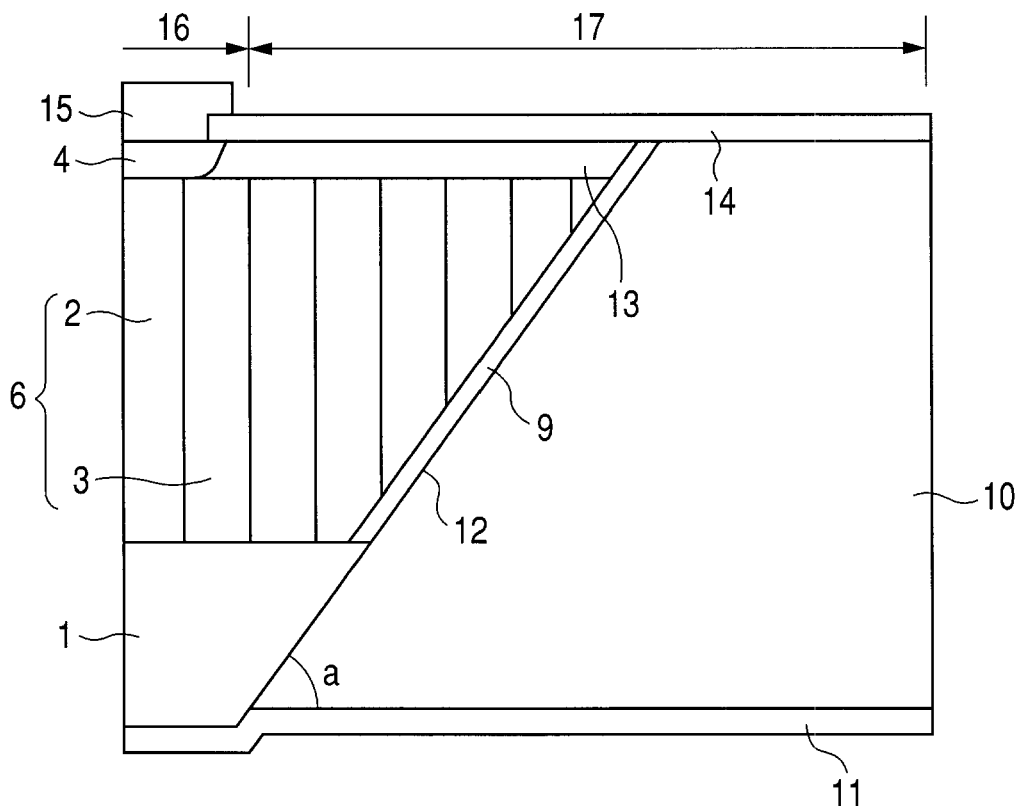
FIG. 19A is a cross-sectional view showing the principal part of the junction termination structure of a MOSFET according to example 6 of the invention.
Figure 19B:
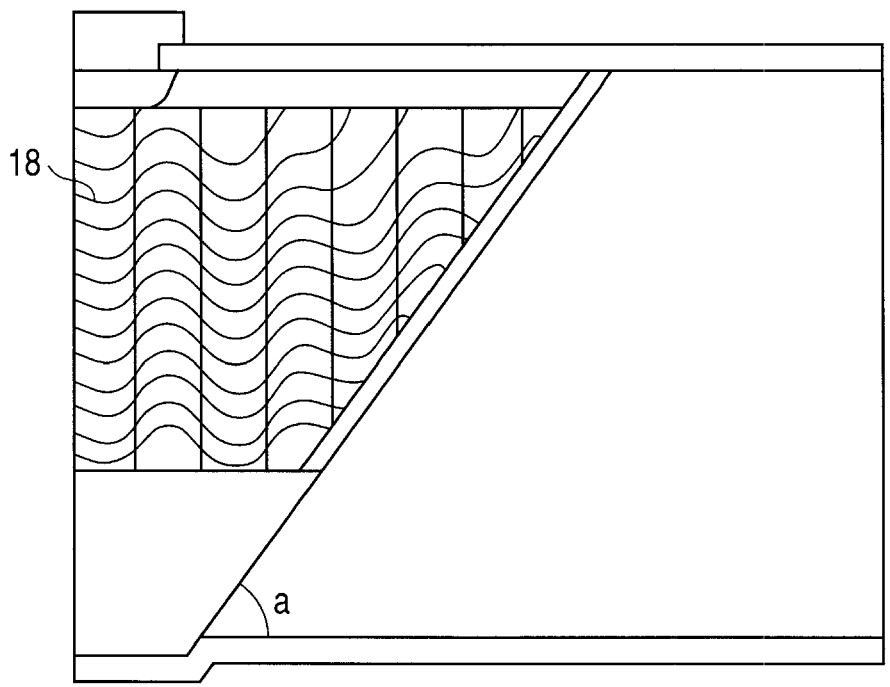
FIG. 19B is a cross-sectional view showing equipotential lines in the junction termination structure shown in FIG. 19A when a reverse bias voltage is applied to the MOSFET.

In Example 6, explanations will be made about a MOSFET with an emphasis on the junction termination structure thereof. FIGS. 19A and 19B are a cross-sectional view showing the principal part of the junction termination structure according to Example 6 and a cross-sectional view showing equipotential lines in the junction termination structure, respectively.

The MOSFET according to Example 6 is a superjunction MOSFET having a RESURF structure. Compared with the superjunction MOSFETs according to Examples 1 and 4, the MOSFET according to Example 6 is common to them in that a semiconductor substrate has a superjunction structure 6 on an $n^{++}$-type Si semiconductor substrate 1 and the superjunction structure 6 includes pin stripe n-type regions 3 and pin stripe p-type isolating regions 2 formed alternately, adjacently, and parallel with each other and perpendicularly to the $n^{++}$-type Si semiconductor substrate 1. While, the MOSFET according to Example 6 is different from the MOSFETs according to Examples 1 and 4 in that the MOSFET according to Example 6 has a RESURF region 13 beneath a silicon oxide film 14 on the principal surface of the semiconductor substrate (also being the surface of the superjunction structure 6) in a section corresponding to an inclined trench 12 in a junction termination structure 17. That is, Example 6 is a combination of the junction termination structure according to Example 1 and other Examples and a RESURF structure as one of related breakdown voltage blocking structures. The RESURF region 13 is a $p^-$-region having an impurity concentration of the order of two digits lower than the impurity concentration of a $p^+$-type well region 4 (on the order of $1.0 \times 10^{14}$ cm$^{-3}$) with an impurity diffusion depth of the order of 3 μm. With the RESURF region 13 being provided, by a reverse voltage applied to a p-n main junction, a depletion layer extending toward the drift layer spreads over both of the surface of the RESURF region 13 and an n-type surface region 9 of the inclined trench 12. Hence, the electric field strength on the surface is further reduced to make it possible to prevent a low voltage breakdown at a breakdown voltage blocking structure. In the cross-sectional view of FIG. 19A, an active region, a silicon oxide film filling the inclined trench 12, a drain electrode, and a source electrode are denoted by reference numerals 16, 10, 11 and 15, respectively. The taper angle "a" of the inclined trench 12 is a positive bevel angle of 54°.

FIG. 19B is a cross-sectional view showing equipotential lines 75 when a reverse bias voltage is applied to the MOSFET according to Example 6 with the equipotential lines 75 additionally drawn in the cross-sectional view in FIG. 19A for exhibiting the way a depletion layer spreads. From the drawing, it is known that, by a reverse voltage applied to the p-n main junction, a depletion layer extending toward the drift layer spreads over both of the surface of the RESURF region 13 and the n-type surface region 9 of the inclined trench 12. Moreover, it is known that, when the applied voltage is low, the depletion layer extends toward the RESURF region 13 and, as the applied voltage increases, passes through the sidewall surface of the inclined trench 12 so as to perpendicularly cross the sidewall surface. As a result, the electric field strength on the surface is reduced to make it possible to prevent a low voltage breakdown at the junction termination structure. Therefore, the breakdown voltage of the superjunction MOSFET in Example 6 is equivalent to that in Example 1. This shows that a combination of the present inclined trench and a known related breakdown voltage blocking structure also allows the necessary width as a junction termination structure to be shortened.

Moreover, the semiconductor device according to the invention causes breakdown at the p-n main junction in the active region. This can ensure a design breakdown voltage specified on the basis of the breakdown voltage of the p-n main junction even though there is some variations in the impurity concentration in the n-type surface region along the sidewall of the inclined trench.

Figure 20:
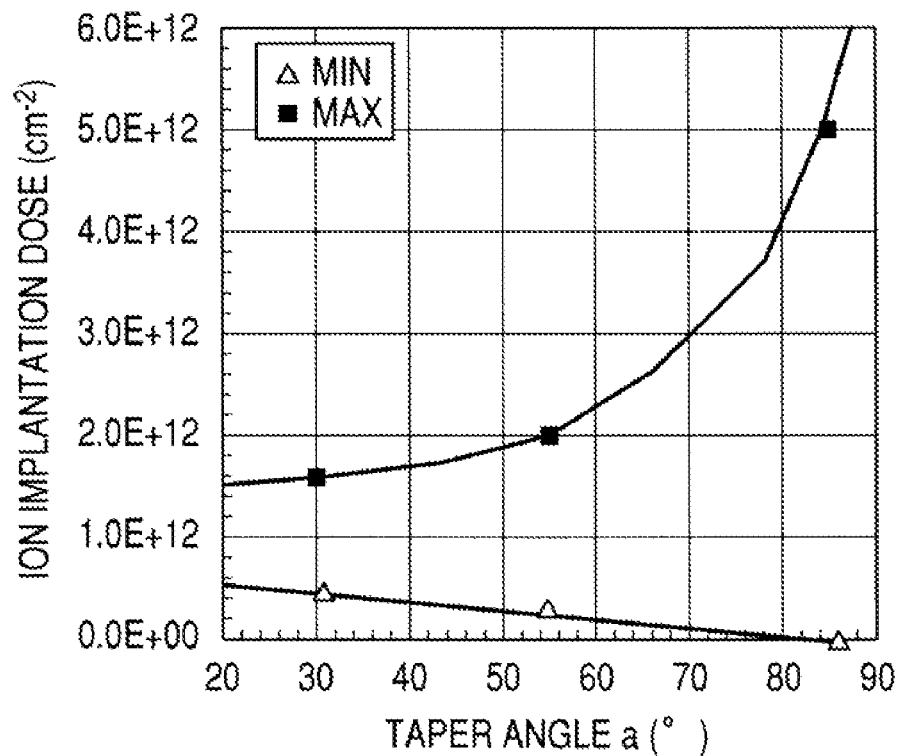
FIG. 20 is a plot showing a relationship between each of the maximum value and the minimum value of the dose for making a breakdown voltage 600 V or more and a taper angle.
Figure 21:
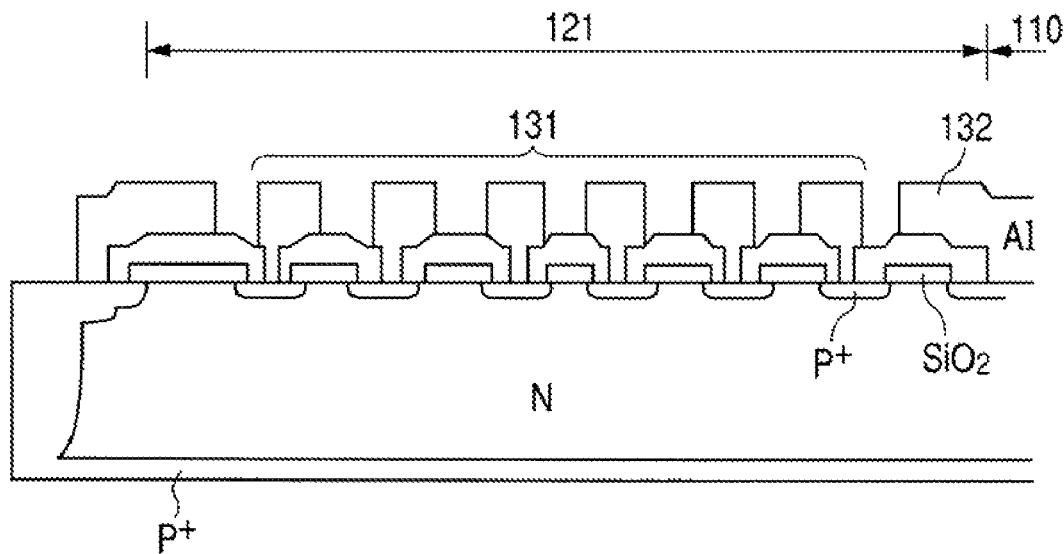
FIG. 21 is a cross-sectional view showing a breakdown voltage blocking structure of a planar type junction termination structure around the outermost periphery of a related semiconductor device.
Figure 22:
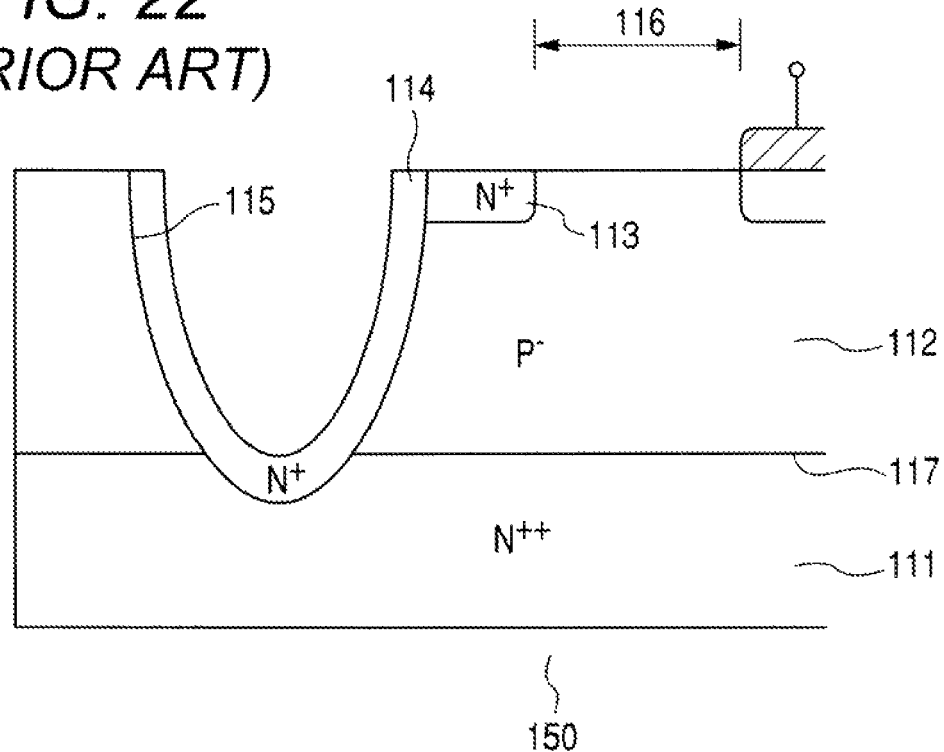
FIG. 22 is a cross-sectional view showing a breakdown voltage blocking structure around the outermost periphery of a related trench type semiconductor device.

FIG. 20 is a plot based on FIGS. 10, 15, and 18 about the relationship between each of the maximum value (Max) and the minimum value (Min) of the ion implantation doses for making the breakdown voltage 600 V or more and the taper angle "a". Namely, the plot shows the correlation between the taper angle of the inclined trench and the preferable range of the implantation dose of impurity ions which correlation was obtained from Example 1 to 6. Impurity ions are implanted into the $n^{++}$-type Si semiconductor substrate in the direction perpendicularly thereto for forming the n-type surface region on the sidewall. In FIG. 20, the dose was expressed as "ION IMPLANTATION DOSE" in the vertical axis. From the plot, it is known that the smaller the trench angle becomes, the narrower the range of the preferable dose of the ion implantation becomes. In a semiconductor device with a taper angle of 30°, the range of a preferable dose is between $5.0 \times 10^{11}$ cm$^{-2}$ and $1.6 \times 10^{12}$ cm$^{-2}$, and more preferably, between $5.05 \times 10^{11}$ cm$^{-2}$ and $1.46 \times 10^{12}$ cm$^{-2}$. The range has a sufficient margin for the ion implantation accuracy in an ion implantation device. This means that somewhat variation in taper angle causes no problem. Furthermore, the range between $5.0 \times 10^{11}$ cm$^{-2}$ and $1.6 \times 10^{12}$ cm$^{-2}$ is a range for the preferable dose for all of taper angles of 30° or more. Therefore, ion implantation carried out with a dose within the range can form an n-type surface region having the effect of the invention even though the side wall has no linear shape with somewhat irregularity or has a curved shape to thereby allow the requirements for the manufacturing process to be relaxed.

In each of related ones of the above-described diode, MOSFET and superjunction MOSFET with a breakdown voltage of 600 V class, the breakdown voltage blocking structure of an ordinary field plate structure on a principal surface is required to have a width (distance) of 350 μm. In comparison, according to the present invention, the width can be reduced down to 100 μm or less. For example, in a chip with an active region of 3 mm square with an area of 9 mm$^2$, a breakdown voltage blocking structure provided around the active region with the width of 350 μm forms the chip of 3.7 mm square with the entire area of 13.69 mm$^2$. In contrast, a chip with an active region of the same area (3 mm square with an area of 9 mm$^2$) with a similarly provided breakdown voltage blocking structure with a width of 100 μm makes the chip formed to be 3.20 mm square with the entire area of 10.24 mm$^2$. Thus, the area of the chip can be reduced to 75% of the former.

In the above Examples, explanations were made regarding the case of diodes and a MOSFET each using an $n^-$ drift layer with relatively high resistance, and superjunction MOSFETs each using a superjunction substrate. In addition to these semiconductor devices, the junction termination structure according to the invention can be also applied to a PT type (FS type) vertical IGBT formed with a MOS gate structure provided on the one principal surface side of an $n^-$ drift layer and with an $n^+$-layer (a field stopping layer) with a high impurity concentration and a $p^+$-layer (a collector layer) with a high impurity concentration provided on the other principal surface side. Also in the case of an IGBT, an element, in which an area ratio of a breakdown voltage blocking structure to the entire chip area is made smaller, can be similarly produced. In addition, the junction termination structure according to the invention can be used in combination with a related breakdown voltage blocking structure.

Furthermore, the explanations were made about the examples in each of which a layer with the impurity concentration of $1.0 \times 10^{13}$ cm$^{-3}$ is used as the n$^-$ drift layer. However, by applying the structure according to the invention regardless of an impurity concentration, an element can be produced with the area ratio of a breakdown voltage blocking structure to the entire chip area being reduced.

When the drift layer is provided with the super junction structure including the pin stripe n-type regions and the pin stripe p-type isolating regions arranged alternately, adjacently, and parallel with each other, the average impurity concentration of the superjunction structure, i.e., the averaged value of respective concentrations of impurities included in the pin stripe n-type regions and the pin stripe p-type isolating regions can be considered as the impurity concentration of the drift layer.

A semiconductor device according to the present can prevent the electric field strength in the semiconductor device from reaching the critical electric field strength causing breakdown in a junction termination structure before in an active region, as well as reducing an area ratio of the junction termination structure to the entire chip area.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2006-026190 filed on 2 Feb. 2006. The disclosure of the priority application, in its entirety, including the drawings, claims, and the specification thereof, is incorporated herein by reference.

What is claimed is:

1. A semiconductor device comprising:
    a semiconductor substrate comprising:
        a first high impurity concentration layer of a first conductivity type;
        a low impurity concentration drift layer of the first conductivity type; and
        a second high impurity concentration layer of a second conductivity type, the second high impurity concentration layer and the drift layer forming a p-n main junction therebetween,
        wherein the drift layer is formed between the first high impurity concentration layer and the second high impurity concentration layer;
    an active region where current flows in the direction of the thickness of the semiconductor substrate; and
    a junction termination structure surrounding an outer periphery of the active region, the junction termination structure comprising:
        a sidewall extending between the first high impurity concentration layer and the second high impurity concentration layer, and forming a positive bevel angle between 30-85° inclusive with respect to a principal surface of the first high impurity concentration layer; and
        a surface region of the first conductivity type defining an outer periphery of the junction termination structure and extending along the sidewall and extending between the first high impurity concentration layer and the second high impurity concentration layer,
        wherein the surface region has an outer peripheral surface that is parallel with the sidewall so that substantially the same positive bevel angle is provided with respect to the principal surface of the first high impurity concentration layer,
        wherein the surface region has an impurity concentration lower than an impurity concentration of the first high impurity concentration layer and an impurity concentration of the second high impurity concentration layer, but higher than an impurity concentration of the drift layer, to decrease electric field strength at an interface between the drift layer and the first high impurity concentration layer so that a depletion layer reaches the first high impurity concentration layer with a voltage lower than the voltage in the active region and to inhibit the depletion layer from spreading in the sidewall, and
        wherein the impurity concentration in the surface region is within a range between $5 \times 10^{11}$ cm$^{-2}$ and $5 \times 10^{12}$ cm$^{-2}$ and increases as the positive bevel angle increases from 30° to 85°.

2. The semiconductor device according to claim 1, wherein the first high impurity concentration layer and the sidewall form an angle of approximately 54°, and a dose for the impurity in the surface region is within a range between $6.2 \times 10^{11}$ cm$^{-2}$ and $1.4 \times 10^{12}$ cm$^{-2}$.

3. The semiconductor device according to claim 1, wherein the first high impurity concentration layer and the sidewall form an angle of approximately 85°, and a dose for the impurity in the surface region is $5.0 \times 10^{12}$ cm$^{-2}$ or less.

4. The semiconductor device according to claim 1, wherein the first high impurity concentration layer and the sidewall form an angle of approximately 30°, and a dose for the impurity in the surface region is within a range between $5.0 \times 10^{11}$ cm$^{-2}$ and $1.6 \times 10^{12}$ cm$^{-2}$.

5. The semiconductor device according to claim 1, further including a passivation film formed on the sidewall.

6. The semiconductor device according to claim 5, wherein the passivation film is an insulator film including a silicon oxide film.

7. The semiconductor device according to claim 1, wherein the semiconductor device is a MOSFET.

8. The semiconductor device according to claim 7, wherein the drift layer is provided with a superjunction structure including pin stripe regions of the first conductivity type and pin stripe isolating regions of the second conductivity type perpendicular to the principal surface of the first high impurity concentration layer and arranged alternately, adjacently, and parallel with each other.

9. The semiconductor device according to claim 1, wherein the semiconductor device is a diode.

10. The semiconductor device according to claim 1, wherein the semiconductor device is an IGBT.

11. A method of forming a semiconductor device, the method comprising the steps of:
    forming a semiconductor substrate comprising:
        a first high impurity concentration layer of a first conductivity type;
        a low impurity concentration drift layer of the first conductivity type; and a second high impurity concentration layer of a second conductivity type, the second high impurity concentration layer and the drift layer forming a p-n main junction therebetween, wherein the drift layer is formed between the first high impurity concentration layer and the second high impurity concentration layer;

forming an active region where current flows in the direction of the thickness of the semiconductor substrate; and forming a junction termination structure surrounding an outer periphery of the active region, the junction termination structure comprising:

a sidewall extending between the first high impurity concentration layer and the second high impurity concentration layer, and forming a positive bevel angle between 30-85° inclusive with respect to a principal surface of the first high impurity concentration layer; and a surface region of the first conductivity type defining an outer periphery of the junction termination structure and extending along the sidewall and extending between the first high impurity concentration layer and the second high impurity concentration layer, wherein the surface region has an outer peripheral surface that is parallel with the sidewall so that substantially the same positive bevel angle is provided with respect to the principal surface of the first high impurity concentration layer, and wherein the surface region has an impurity concentration lower than an impurity concentration of the first high impurity concentration layer and an impurity concentration of the second high impurity concentration layer, but higher than an impurity concentration of the drift layer, to decrease electric field strength at an interface between the drift layer and the first high impurity concentration layer so that a depletion layer reaches the first high impurity concentration layer with a voltage lower than the voltage in the active region and to inhibit the depletion layer from spreading in the sidewall, and wherein the impurity concentration in the surface region is within a range between $5 \times 10^{11}$ cm$^{-2}$ and $5 \times 10^{12}$ cm$^{-2}$ and increases as the positive bevel angle increases from 30° to 85°.

12. The method according to claim 11, wherein the surface region is formed by ion implantation with impurity ions.

13. The method according to claim 12, wherein the ion implantation with impurity ions is carried out perpendicularly to the principal surface of the first high impurity concentration layer.

14. The method according to claim 11, wherein the semiconductor device further includes a passivation film formed on the sidewall.

15. The method according to claim 14, wherein the passivation film is an insulator film including a silicon oxide film formed by application.

* * * * *